United States Patent [19]
Soh et al.

[11] Patent Number: 5,618,760
[45] Date of Patent: Apr. 8, 1997

[54] METHOD OF ETCHING A PATTERN ON A SUBSTRATE USING A SCANNING PROBE MICROSCOPE

[75] Inventors: Hyongsok Soh, Stanford, Calif.; Stephen C. Minne, Danville, Ill.; Calvin F. Quate, Stanford, Calif.

[73] Assignee: The Board of Trustees of the Leland Stanford, Jr. University, Stanford, Calif.

[21] Appl. No.: 311,763

[22] Filed: Sep. 23, 1994

Related U.S. Application Data

[63] Continuation-in-part of Ser. No. 297,691, Aug. 26, 1994, abandoned, which is a continuation-in-part of Ser. No. 296,340, Aug. 25, 1994, abandoned, which is a continuation-in-part of Ser. No. 226,784, Apr. 12, 1994, Pat. No. 5,517, 280.

[51] Int. Cl.[6] ............................................. H01L 21/465
[52] U.S. Cl. .................. 438/703; 437/935; 148/DIG. 46; 438/949; 438/947
[58] Field of Search .................................... 437/228, 983, 437/229, 238, 239, 935; 156/656, 657, 659.1, 662, 668; 148/DIG. 46

[56] References Cited

U.S. PATENT DOCUMENTS

| | | | |
|---|---|---|---|
| 4,479,831 | 10/1984 | Sandow et al. | 148/1.5 |
| 5,138,174 | 8/1992 | Tang | 250/492.3 |
| 5,221,415 | 7/1993 | Albrecht et al. | 156/629 |
| 5,227,626 | 7/1993 | Okada et al. | 250/234 |
| 5,254,854 | 10/1993 | Betzig | 250/234 |
| 5,345,815 | 9/1994 | Albrecht et al. | 73/105 |
| 5,354,985 | 10/1994 | Quate | 250/234 |

FOREIGN PATENT DOCUMENTS

WO9429894  12/1994  WIPO .

OTHER PUBLICATIONS

Dagata et al, "Modification of hydrogen–passivated silicon by a scanning tunneling microscope operating in air", Appl. Phys. Lett. vol. 26, No. 20, May 1990, pp. 2001–2003.
Barniol et al, "Modification of HF–treated silicon (100) surfaces by scanning tunneling microscope under imaging conditions", Appl. Phys. Lett.
Dagata et al, "Pattern generation on semiconductor surfaces by a scanning tunneling microscope operating in air", J. Vac Sci. B, vol. 9, No. 2 Mar., 1991 pp. 1384–1388.
"Silicon Processing for the VLSI Era vol. 1: Process Technology", Wolf et al., Lattice Press, 1986, pp. 209–210.
"Nanometer Lithography on Silicon and hydrogenated Amouphous Silicon with Low Energy Electrons", Kramer et al., abstract, International Conference on Micro and Nano-fabrication, Sep. 1994.
"Silicon Processing for the VLSI Era vol. 2: Process Integration", S. Wolf, Lattice Press, pp. 297–300.

(List continued on next page.)

*Primary Examiner*—John Niebling
*Assistant Examiner*—Thomas G. Bilodeau
*Attorney, Agent, or Firm*—Skjerven, Morrill, MacPherson, Franklin & Friel; David E. Steuber

[57] ABSTRACT

A scanning probe microscope is used to pattern a layer of resist, and the pattern is transferred to a substrate. First, an underlayer formed of, for example, polyimide and a top layer formed of, for example, amorphous silicon are deposited on the substrate. A pattern is formed on the top layer using the tip of the cantilever in a scanning probe microscope. The pattern may consist of an oxide formed by an electric field at the cantilever tip. The top layer is then etched using the pattern as a mask and using an etchant that is selective against the underlayer. The underlayer is then etched using an etchant that is selective against the top layer and substrate. The substrate is etched with an etchant that removes the top layer but is selective against the underlayer. Finally, the underlayer is removed.

37 Claims, 23 Drawing Sheets

OTHER PUBLICATIONS

N. Kramer et al., "Fabrication of Metallic Nanowires with a Scanning Tunneling Microscope", 1995 American Institute of Physics, Appl. Phys. Lett. 66 (11), 13 Mar. 1995, pp. 1325–1327.

H. Sugimura et al., "Maskless patterning of silicon surface based on scanning tunneling microscope tip–induced anodization and chemical etching", Appl. Phys. Lett. 65(12), 19 Sep. 1994, pp. 1569–1571.

D. Wang et al., "Nanometer–structure writing on Si(100) surfaces using a non–contact–mode atomic force microscope", Appl. Phys. Lett. 65(11), 12 Sep. 1994, pp. 1415–1417.

"Thermomechanical writing with an atomic force microscope tip", H.J. Mamin et al., Appl. Phys. Lett. 61(8), 24 Aug. 1992, pp. 1003–1005.

"The atomic force microscope used as a powerful tool for machining surfaces", T.A. Jung et al., Elsevier Science Publishers, 1992, pp. 1446–1451.

"25 nm chromium oxide lines by scanning tunneling lithography in air", H.J. Song et al., 38th Int'l. Symp. on Electron, Ion and Photon Beams, New Orleans, LA, May 31–Jun. 3, 1994, 16 pgs.

"Nanometer–scale lithography using the atomic force microscope", A. Majumdar et al., Appl. Phys. Lett. 61(19), 9 Nov. 1992, pp. 2293–2295.

"Tip–induced anodization of titanium surfaces by scanning tunneling microscopy: A humidity effect on nanolithography", H. Sugimurar et al., Appl. Phys. Lett. 62(9), 30 Aug. 1993, pp. 1288–1290.

"Nanometer scale patterning of silicon (100) surfaces by an atomic force microscope operating in air", L. Tsau et al., Appl. Phys. Lett. 64(16), 18 Apr. 1994, pp. 2133–2135.

"Fabrication of Si nanostructures with an atomic force microscope", E.S. Snow et al., Appl. Phys. Lett. 64(15), 11 Apr. 1994, pp. 1932–1934.

"Lithographic patterning of self–assembled films", J.M. Calvert, J. Vac. Sci. Technol. B 11(6), Nov./Dec. 1993, pp. 2155–2163.

"Self–assembled monolayer electron beam resist on GaAs", R.C. Tiberio et al., Appl. Phys. Lett. 62(5), 1 Feb. 1993, pp. 476–478.

"Low voltage electron beam lithography in self–assembled ultrathin films with the scanning tunneling microscope", C.R.K. Marrian et al, Appl. Phys. Lett. 64(3), 17 Jan. 1994, pp. 390–392.

"Scanning Probe Lithography. 1. Scanning Tunneling Microscope Induced Lithography of Self–Assembled n–Alkanethiol Monolayer Resists", C.B. Ross et al., American Chemical Society, Langmuir, vol. 9, No. 3, 1993, pp. 632–636.

"Modification of Silicon Surface Produced by Electric Field Enhanced Oxidation Through Native Oxide", Y. Ejiri et al., Extended Abstracts of 1993 Int'l. Conf. on Solid State Devices and Materials, 1993, pp. 606–608.

"Fabrication of silicon nanostructures with a scanning tunneling microscope", E.S. Snow et al., Appl. Phys. Lett. 63(6), 9 Aug. 1993, pp. 749–751.

"Nanometre–scale chemical modification using a scanning tunnelling microscope", Y. Utsugi, Nippon Telegraph and Telephone Corp., LSI Laboratories, undated, 2 pgs.

"Atomic Force Microscopy Using A Piezoresistive Cantilever", M. Tortonese et al., IEEE, Mar. 1991, pp. 448–450.

"Fabrication of Si nanostructures with an atomic force microscope", E.S. Snow et al., Appl. Phys. Lett. 64(15), 11 Apr. 1994, 12 pgs.

"Applications of Atomic Force Microscopy for Nanolithography", P.I. Oden et al., undated, 7 pgs.

*Technology of proximal probe lithography*, "Principles and Techniques of STM Lithography", M.A. McCord et al, 1993, The Society of Photo–Optical Instrumentation Engineers, pp. 16–32.

*Technology of proximal probe lithography*, "Low Voltage E–Beam Lithography With The STM", C.R.K. Marrian et al., 1993, The Society of Photo–Optical Instrumentation Engineers, pp. 58–73.

*Technology of proximal probe lithography*, "The Technology of Proximal Probe Lithography: An Overview", J.A. Dagata et al, 1993, The Society of Photo–Optical Instrumentation Engineers, pp. 3–11.

"Nanometer lighography on silion and hydrogenated amorphous silicon with low energy electrons", N. Kramer et al., undated, 30 pgs.

"Silicon transfer layer for multilayer resist systems", J.B. Kruger et al., J.Vac. Sci. Technol., 19(4), Nov./Dec. 1981, pp. 1320–1324.

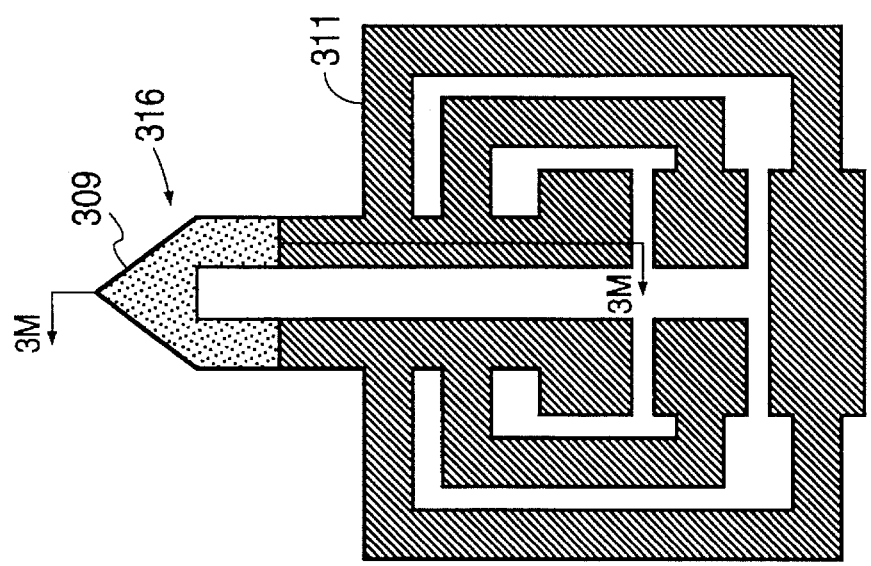
FIG. 3M1
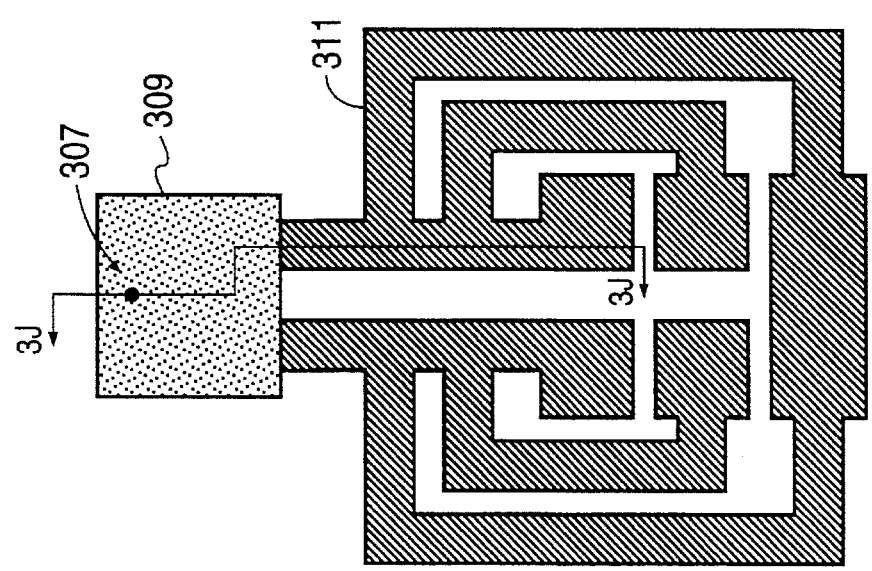
FIG. 3J1

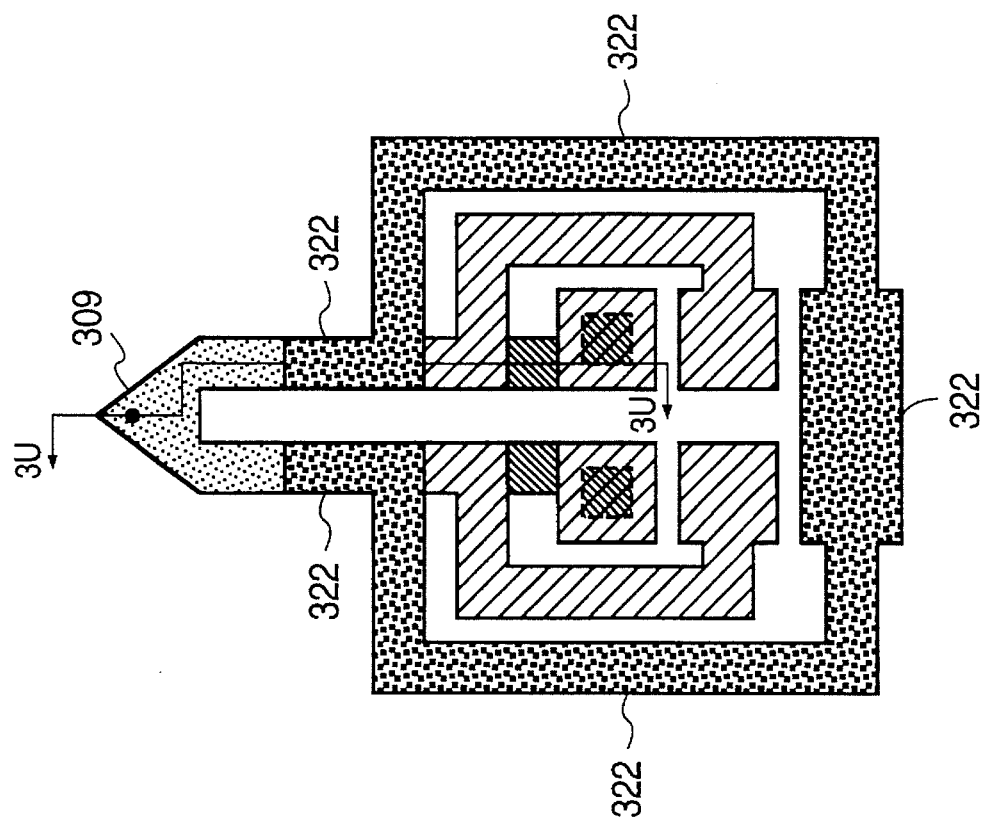
FIG. 3U1
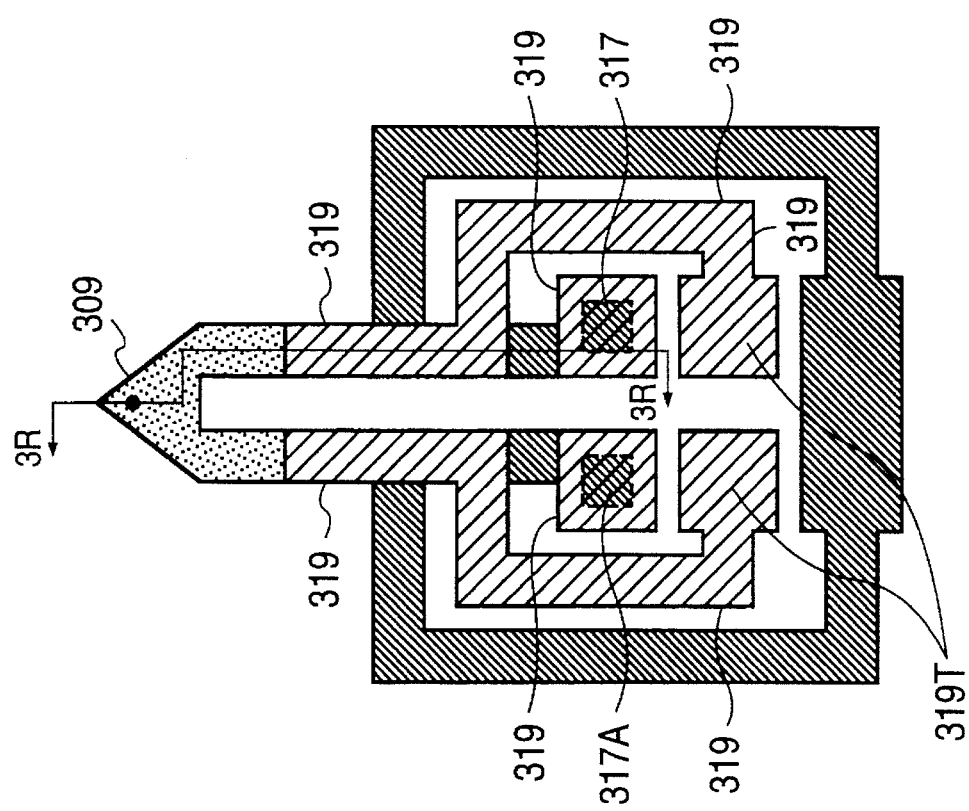
FIG. 3R1

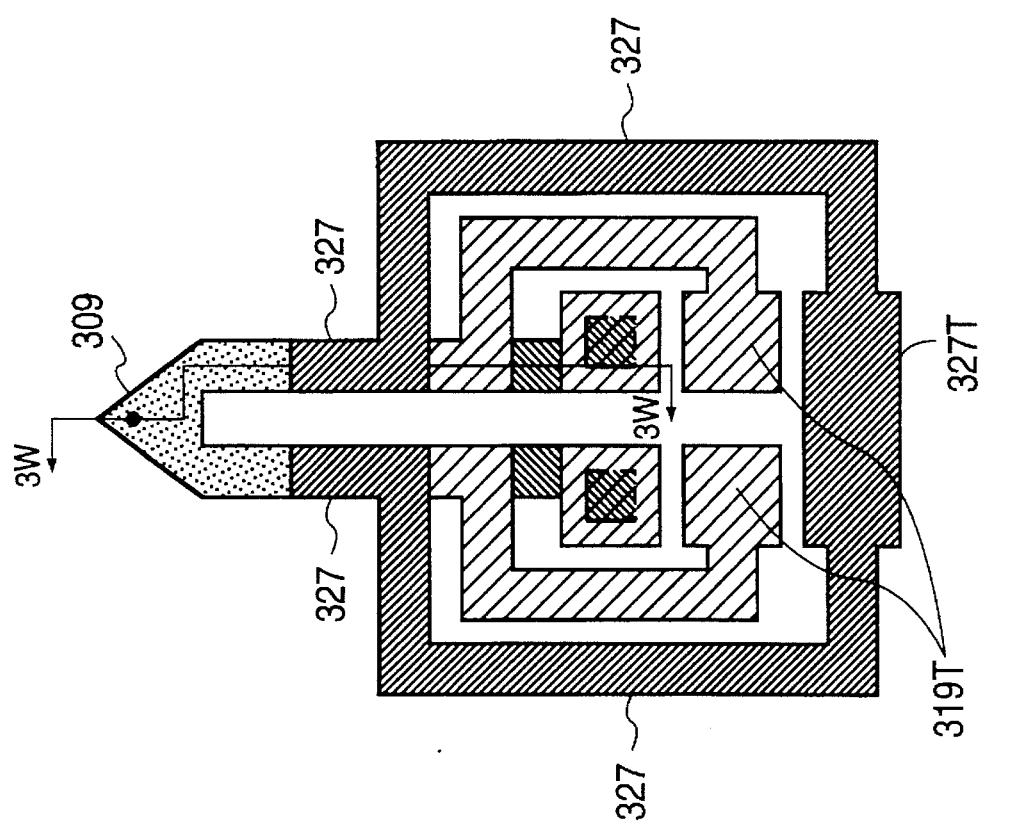

5,618,760

METHOD OF ETCHING A PATTERN ON A SUBSTRATE USING A SCANNING PROBE MICROSCOPE

This invention was made with Government support under Contract No. N00014-91-J-1050-P00006, awarded by the Office of Naval Research, Department of the Navy. The Government has certain rights in this invention.

This application is a continuation-in-part of application Ser. No. 08/297,691, filed Aug. 26, 1994, now abandoned which is a continuation-in-part of application Ser. No. 08/296,340, filed Aug. 25, 1994, now abandoned, which is continuation-in-part of application Ser. No. 08/226,784, filed Apr. 12, 1994, now U.S. Pat. No. 5,517,280, issued May 14, 1996 all of which are incorporated herein in their entirety.

FIELD OF THE INVENTION

This invention relates to the fabrication of transistors and other electronic devices and, in particular, to the fabrication of a transistor such as a metal-oxide-silicon field-effect-transistor (MOSFET) using a scanning probe microscope.

BACKGROUND OF THE INVENTION

The progress of integrated circuit technology has been marked by a continuing reduction in the size of individual devices on each semiconductor chip. Smaller devices yield the dual advantages of greater packing density and increased speed. One of the principal problems currently facing engineers and scientists in the integrated circuit (IC) field is the development of techniques for defining smaller features on the surface of the chip. As is well known, features have conventionally been defined using a photoresist which is exposed, through a mask, to some form of light radiation. Initially, visible light was used, but the desire for smaller feature size has led to the use of UV light and x-rays. However, the minimum feature size that is feasible using optical lithography is approximately 0.2 µm. Currently, development efforts are under way to achieve a transistor which has a gate length of 0.2 µm or less. Thus, a technique is needed for defining features having sizes within this range.

SUMMARY OF THE INVENTION

In accordance with this invention, a feature of a transistor or other electronic device is defined on the surface of a substrate using an electric field generated at the tip of a cantilever in a scanning probe microscope (SPM). An electric field is generated at the tip of the cantilever, preferably by fabricating a conductive path extending to the tip of the cantilever and applying a voltage to the conductive path. The tip is biased to a first voltage and the substrate is biased to a second voltage (either of which may be ground voltage). The tip is then scanned over the surface of the substrate, preferably in a raster pattern.

The surface of the substrate is typically formed of silicon or a metal, preferably amorphous silicon or polysilicon. The electric field at the tip of the cantilever causes an oxide pattern to form on the surface of the substrate, and the substrate is then etched using an etchant which does not attack the oxide. In this manner, a line having a width as small as 0.01 µm may be formed and a corresponding feature may be formed on the surface of the substrate.

This technique may be used to define various features of different kinds of electronic devices. In a preferred embodiment, the technique is used to define the gate of a metal-oxide-silicon field-effect-transistor (MOSFET). A layer of amorphous silicon is deposited on a gate oxide layer, and the gate is defined using an electric field generated at the tip of an SPM cantilever. The gate is formed by etching the layer of amorphous silicon. A MOSFET fabricated by means of this method is extremely small and fast, and may have a gate length of 0.2 µm or less. In another embodiment a gate contact pad adjoining the gate is also formed with the scanning tip, and this eliminates the need for a photomask at this stage.

In accordance with another aspect of this invention, the oxide pattern formed using the scanning tip is itself used as a feature of a transistor or other electronic device.

In accordance with yet another aspect of this invention, an SPM is used to define features using a two layer structure, comprising a top layer and an underlayer, which is deposited on the surface of a substrate to be patterned. The top layer is formed of a material which may be modified (e.g., oxidized) by a phenomenon created at the tip of an SPM. The phenomenon may be a field such as an electric, magnetic or electromagnetic field, a current such as an electron or photon current (electromagnetic radiation), or a force interaction between the tip and the top layer. In any case, the result of using the SPM is to create a pattern on or in the top layer. In many embodiments, the pattern is formed on the surface of the top layer, and the top layer is etched, preferably with an etchant which does not attack the underlayer, to expose the underlayer.

The underlayer is then etched with an etchant that does not attack the top layer, leaving a pattern on the surface of the substrate. The substrate is then etched, preferably with an etchant which removes the top layer but does not attack the underlayer. After the substrate has been suitably etched, the remaining portions of the underlayer are removed.

The top layer is preferably formed of amorphous silicon, which forms an oxide layer in the presence of an electric field at the SPM tip. The amorphous silicon may be etched with a wet or dry etch. The underlayer may be formed of polyimide, which may be etched with an oxygen plasma.

A variation of the process may be required where the amount of the substrate to be etched is less than the amount of the substrate that would be etched in the course of removing the top layer. One such variation entails etching only a portion of the top layer and then etching the underlayer so as to undercut and lift off the remaining part of the top layer. A second variation entails partially etching the underlayer, removing the remaining portions of the top layer, and then etching the underlayer so as to remove the portions of the underlayer over the areas of the substrate to be etched.

Another alternative process yields a positive resist, wherein areas of the substrate underlying the modified areas of the resist are etched. The underlayer is formed of a material that readily oxidizes in the presence of oxygen, and it is deposited in a vacuum or oxygen-free atmosphere. The top layer is deposited in the same environment and is patterned using an SPM. The top layer is then etched and the exposed areas of the underlayer are exposed to air or directly oxidized such that an oxide layer forms on these areas. The structure is then exposed to an etchant which attacks both the top layer (including the oxide formed by the SPM) and the underlayer relatively quickly but attacks the oxide layer on the underlayer relatively slowly. The oxidized portions of the underlayer remain and form a mask for etching the exposed areas of the substrate.

The techniques of this invention may be performed with various kinds of SPMs, including atomic force microscopes (AFMs) and scanning tunneling microscopes (STMs).

BRIEF DESCRIPTION OF THE DRAWINGS

FIGS. 3A–3AA and FIGS. 3J1, 3M1, 3R1, 3U1 and 3W1 illustrate steps in the process of fabricating a cantilever for use in the method of this invention.

DESCRIPTION OF THE INVENTION

Figure 1:
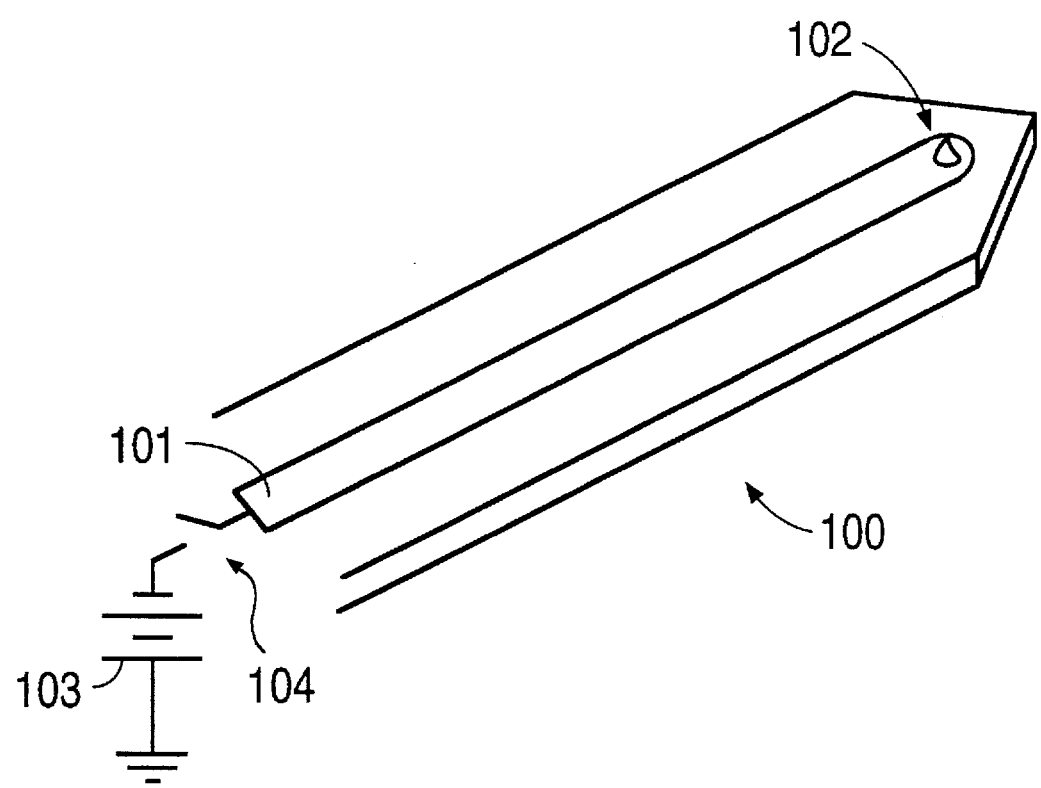
FIG. 1 illustrates a general view of a cantilever used for performing lithography by means of an electric field.

FIG. 1 illustrates a simplified schematic diagram of a cantilever 100 of an atomic force microscope (AFM) in accordance with this invention. An electrical conductive path 101 extends from the base of cantilever 100 to a conductive tip 102. Conductive path 101 may comprise, for example, a metallic coating applied to cantilever 100 or a region of doped semiconductor material within cantilever 100. By means of conductive path 101, tip 102 is biased with respect to the substrate which is to be patterned. A voltage source 103 is provided to supply a voltage to tip 102 via path 101, or the voltage source may be connected to the substrate. A switch 104 may be provided in conductive path 101. Lithography is performed by means of an electric field which is formed at tip 102.

To perform lithography with cantilever 100, a silicon surface is oxidized to form an etch mask. Preferably a layer of amorphous silicon is used for this purpose, although polysilicon or silicon may also be used. The amorphous silicon layer may be deposited by chemical vapor deposition (CVD), plasma enhanced chemical vapor deposition (PECVD), low pressure chemical vapor deposition (LPCVD), sputtering or evaporation. In the preferred method, the silicon surface is passivated by cleaning it and dipping it in a solution containing hydrogen (e.g., a 10:1 deionized water:hydrofluoric acid solution). Hydrogen from the solution bonds to dangling bonds on the silicon surface and forms a passivating monolayer free from the dangling silicon bonds. The passivated surface is exposed to an intense electric field from tip 102 in the presence of water vapor or oxygen. The electric field disrupts the bond between the silicon and hydrogen atoms and thereby exposes a fresh silicon surface. The molecules of water vapor are activated by the electric field, and the free oxygen that results from this activation process combines with the exposed silicon atoms to form an oxide layer. This process is described in E. S. Snow et al., "Fabrication of Si nanostructures with an atomic force microscope" Appl Phys. Lett. 64(15), 11 Apr. 1994, pp. 1932–1934, which is incorporated herein by reference.

Unpassivated silicon surfaces grow a thin layer of native oxide when exposed to air. If the above described electric field-enhanced oxidation process is carried out on an oxidized silicon surface, the thickness of the oxide in the region exposed to the electric field will increase, and this thick oxide may be used as an etch mask. This process is described in L. Tsau et al., "Nanometer scale patterning of silicon (100) surfaces by an atomic force microscope operating in air" Appl Phys Lett 64(16), 18 Apr. 1994, pp. 2133–2135, which is incorporated herein by reference.

In some instances, the surface being patterned can be covered with a liquid layer such as water and in this case the process is electrochemical in nature and the formation of the oxide is termed "anodization". In other instances, a controlled atmosphere such as oxygen or ambient with high relative humidity may be employed to enhance the rate of oxidation. The environment could also be controlled by modifying (increasing) the temperature or the pressure of the surrounding atmosphere or the partial pressure of individual gases such as oxygen or by introducing new elements such as nitrous oxide (for nitridation), oxygen ions or ozone.

Cantilever 100 is scanned over the surface of a silicon substrate, preferably in a raster pattern. The AFM is preferably operated in the contact mode, with the tip 102 in contact with the silicon surface. Since the silicon substrate is grounded (or connected to some other reference voltage different from the voltage applied to tip 101), an electric field is formed between tip 101 and the surface of the substrate. As described above, this causes a layer of oxide to be formed on the surface of the substrate. Alternatively, the probe may be used in the non-contact mode.

As cantilever 100 is scanned over the silicon surface, the application of the electric field to the silicon surface is controlled, thereby causing the surface to be oxidized only in regions where an etch mask is desired. The electric field at tip 102 may be controlled either by providing a switch in conductive path 101 or by lifting cantilever 100 from the surface of the silicon substrate. Circuitry for controlling the electric field in these ways is described below in conjunction with FIGS. 5A and 5B.

Fabrication of MOSFET

Figure 2A:
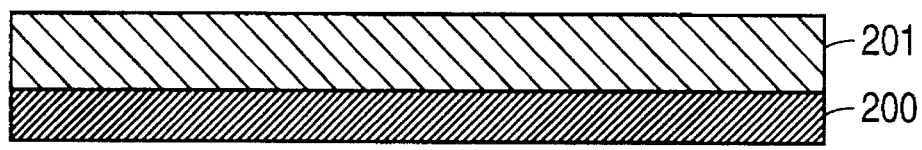
FIGS. 2A–2Q illustrate steps of fabricating the gate of a MOSFET in accordance with this invention.
Figure 2B:
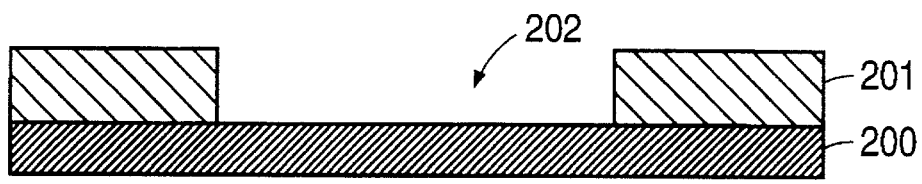

The fabrication of one embodiment of a MOSFET in accordance with this invention will now be described with reference to FIGS. 2A–2P. FIG. 2A shows a silicon substrate 200 and an overlying field oxide layer 201, which is preferably about 5200 Å thick. Silicon substrate 200 is initially cleaned, and field oxide layer 201 is grown using conventional techniques. Substrate 200 is <100> p-type silicon having a resistivity of 0.1 ohms-cm.

Using a conventional masking technique, an active device area 202 is formed. If field oxide layer 201 is 0.5 microns thick, it may be etched with an HF(6:1) solution for 6.0–6.5 minutes. A wet etch is used instead of a reactive ion etch (RIE), to create a smooth slope on the side walls of the field oxide layer 201. As described below, this makes it easier to pattern the device using an AFM tip. The resulting structure is shown in FIG. 2B. If desired, a threshold implant oxide (not shown) may be grown on the exposed surface of substrate 200, and a threshold voltage adjust implant may be performed using a known process, after which the threshold implant oxide is stripped.

Figure 2C:
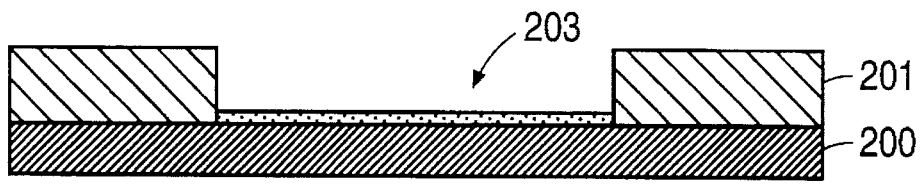
Figure 2D:
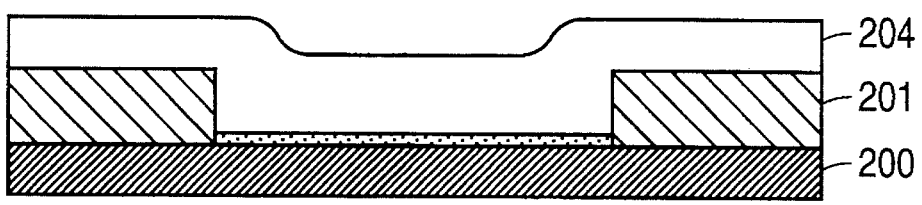

The substrate 200 is then cleaned, and a gate oxide layer 203 is thermally grown, as shown in FIG. 2C. In one embodiment, gate oxide layer 203 is 75 Å thick and is formed with a 25 minute dry oxidation at 850° C. Next, as shown in FIG. 2D, a layer 204 of amorphous silicon is deposited on the surface of the structure. A low pressure chemical vapor deposition (LPCVD) process is used to deposit the amorphous silicon to a thickness of approximately 1000 Å. The process is carried out at a temperature of 560° C.

Figure 2E:
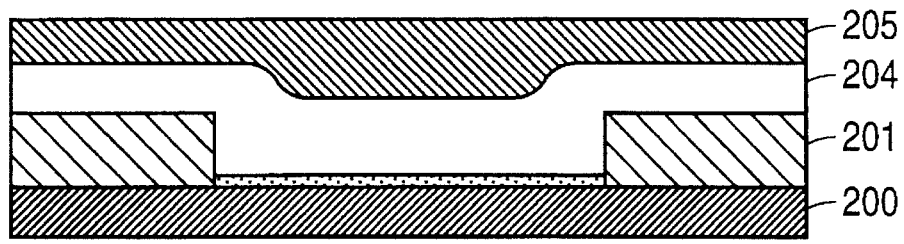
Figure 2F:
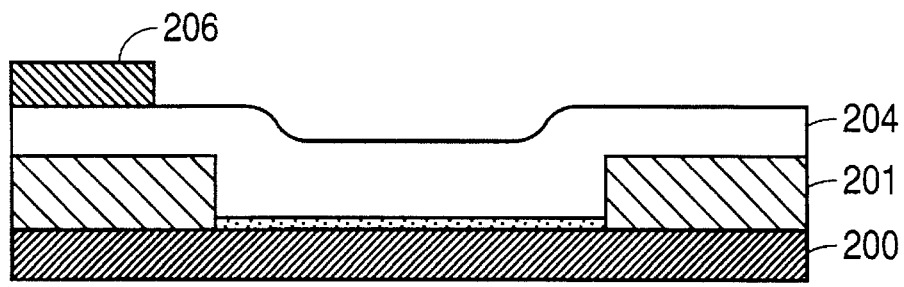

As shown in FIG. 2E, a layer of photoresist 205 is deposited on the surface of the amorphous silicon layer 204. Photoresist layer 205 is then patterned using conventional photolithographic techniques to form a gate contact pad region 206, shown in the cross-sectional view of 2F and the plan view of 2G. The portion of resist layer 205, which forms gate contact pad region 206, is left in place.

Figure 4A:
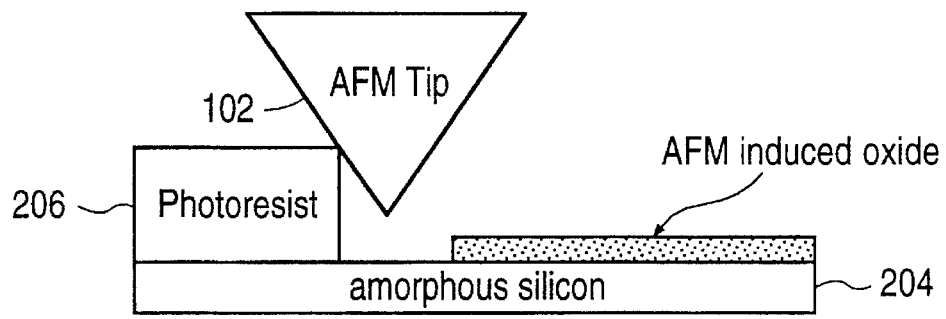
FIG. 4A illustrates the lifting of the cantilever tip from the surface of the substrate when the tip encounters a steep feature on the substrate.

To perform lithography, the cantilever tip should remain in contact with the surface to be lithographed. Therefore, because the tip has a finite width, any large, steep edges on the surface of the structure should be avoided. As shown in FIG. 4A, a thick layer of photoresist having steep edges may cause an AFM tip to leave the surface of the silicon. Where this happens, the oxide layer will not be formed and the surface of the silicon will not be properly lithographed.

To avoid this problem, a photoresist having a low viscosity is applied in a spin coating machine at a high speed of rotation. The photoresist is AZ14-17 applied at 5000 rpm for 40 seconds. This yields a photoresist layer 205 having a thickness of approximately 0.3 μm. Advantageously, the amorphous silicon surface is cleaned in an oxygen plasma after the patterning of the photoresist. An oxygen flow rate of 100 sccm, at a pressure of 150 mTorr and RF power of 0.8 W/cm$^2$ for 2 minutes may be used. The oxygen plasma provides a controlled way to thin the photoresist further.

Figure 4B:
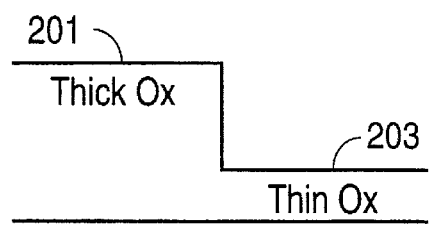
FIGS. 4B–4D illustrate a method of "smoothing" sharp features by depositing a conformal oxide.
Figure 4C:
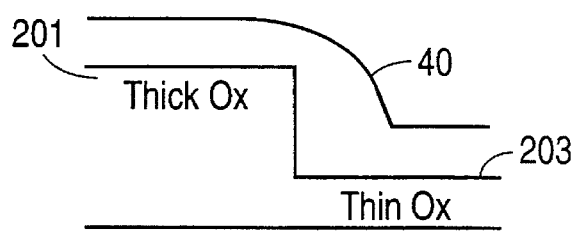
Figure 4D:
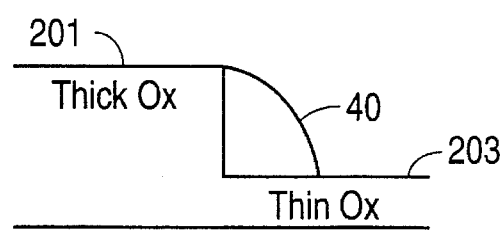

A similar problem can occur at the sharp step between field oxide layer 201 and gate oxide layer 203 (see FIG. 2C). This step may be transmitted to the overlying amorphous silicon layer 204 (FIG. 2D) and can result in a sharp, steep profile which will lift the tip from the amorphous silicon as it traverses the step. To overcome this problem, the step between oxide layers 201 and 203 can be graded by depositing a conformal oxide over the entire surface and then etching it away. The thickness of the conformal oxide layer varies in the region of the sharp step, and subsequent removal of the conformal oxide will produce a "smoothing" effect. A single step is illustrated in FIGS. 4B–4D, showing a conformal oxide layer 40. FIG. 4C shows the conformal oxide layer 40 before etching and FIG. 4D shows the conformal oxide layer 40 after etching. This process may be repeated several times, if necessary, to further reduce the size and steepness of the step.

The problem of tip lift-off at the edge of the field oxide layer may also be reduced by using a thin (e.g., 1000 Å) field oxide region or by using an isolation technique which provides a gentle slope to the field oxide. One such technique is local oxidation of silicon (LOCOS) and its variations (e.g., fully recessed oxide LOCOS, polybuffered LOCOS, or sealed-interface local oxidation). As described in Muller and Kamis, , "Device Electronics For Integrated Circuits" 2nd Edition, Wiley & Sons (1986), pp. 97–98, incorporated herein by reference, the edges of a field oxide region formed by a LOCOS process are tapered, and this minimizes the chances of tip lift-off.

After the formation of gate contact pad region 206, the structure is now ready for lithography using the AFM. Initially, the AFM is used in a conventional imaging mode to determine the location of the active area 202 and the desired location of the gate. In one example, the tip of the cantilever was biased at 20 V and was scanned at a frequency of 0.01 Hz in the direction shown in FIG. 2G for 10 minutes. The tip therefore made six passes (both directions), and in this process formed an oxide region 207 having a width W of 55 μm and a length L of 0.7 μm (see FIG. 2G). The rate at which the tip passes over the substrate (scan rate) is determined by the scan length and the scan frequency. The required scan length is determined by the width of the device, plus the distance from the gate region to the gate pad, plus any overlap that is desired. For example, a 30 μm device with the gate pad 10 μm away, would have a scan length of 50 μm if 5 μm of overlap is desired at the contact pad and the opposite end of the gate. The scan rate and frequency are determined by the quality and thickness of the line desired for the particular application. For example, if a scan rate of 0.5 μm/sec will produce an adequate line in a single pass, then a 50 μm scan will take 100 seconds. Since a single pass corresponds to half a period, the full period is 200 seconds, and the scan frequency is 0.005 Hz. In the future, scan rates may increase to the range of centimeters per second.

The width W of the oxide region 207 might be in the range of less than 1 μm to 75 μm or more. The width of the device determines how much current the device can pass. One reason for reducing the gate length is to improve the current carrying capacity of the transistor per unit of width. If a device can be made to carry more current, it can be reduced in width for a particular application. This in turn increases the packing density of transistors on the chip.

Figure 2H:
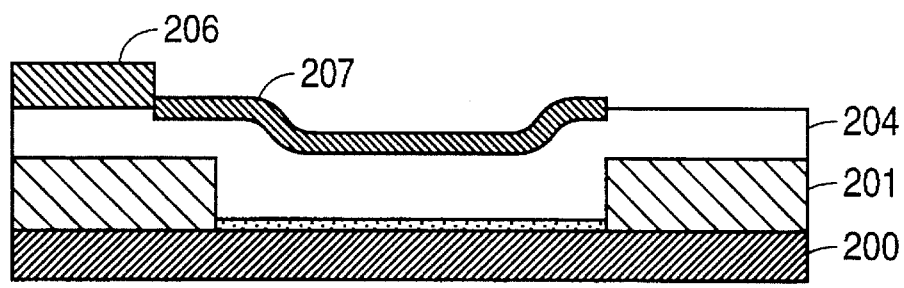
Figure 2I:
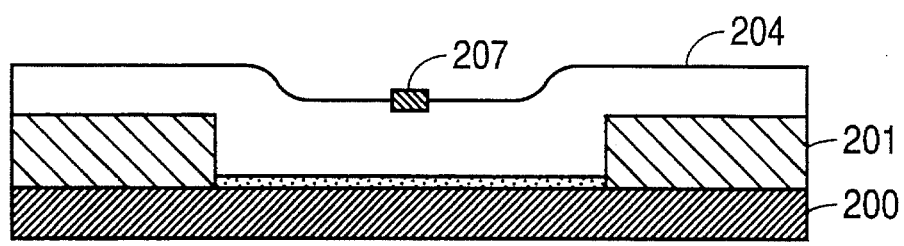
Figure 2G:
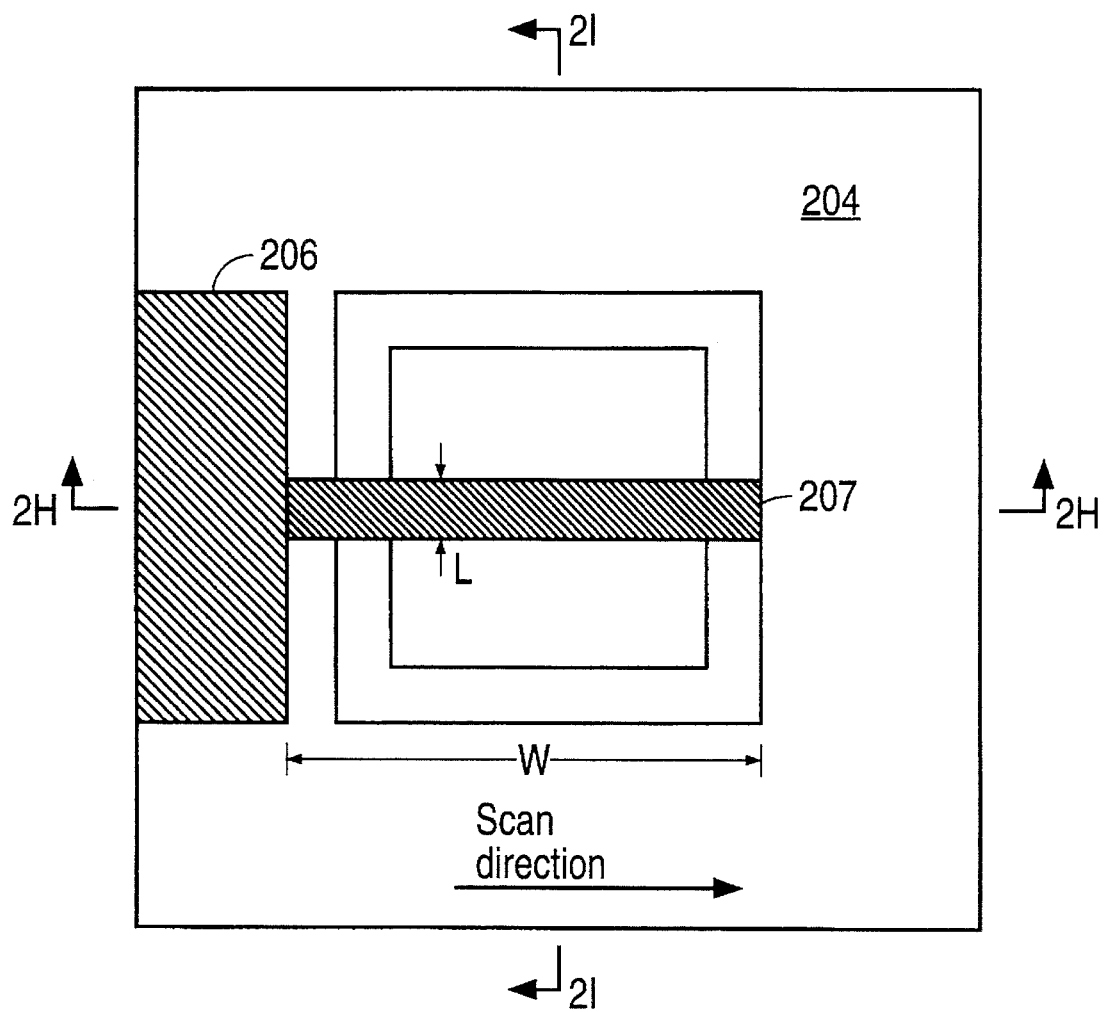

A cross-sectional view taken at section 2H—2H (FIG. 2G) is shown in FIG. 2H, and a view taken at section 2I—2I (FIG. 2G) is shown in FIG. 2I. As shown in FIGS. 2G and 2H, it is important that one end of oxide region 207 be joined with gate contact pad region 206.

Amorphous silicon layer 204 is then etched, using an etchant which does not attack the resist which is used to define the gate contact pad region 206 or the oxide which defines the gate. A dry etch process using a 1:1 SF$_6$:Freon 115 plasma, at 150 mTorr with 0.22 W/cm$^2$ RF power is preferred. This plasma etches amorphous silicon at roughly 3700 Å/minute and oxide at 100 Å/minute.

Figure 2J:
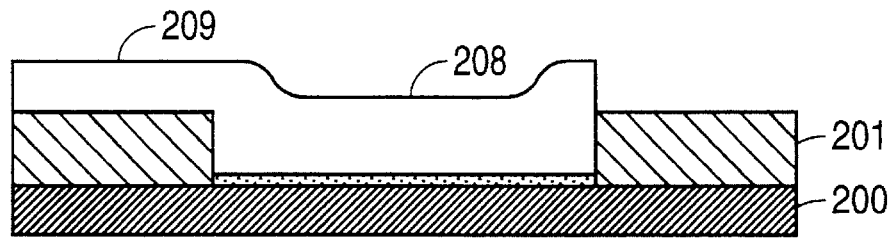
Figure 2K:
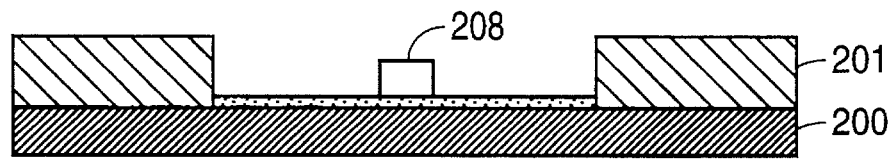

The resulting gate 208 is illustrated in FIGS. 2J and 2K. FIG. 2J also shows a portion of the gate contact pad 209. FIGS. 2J and 2K are taken at cross sections 2H—2H and 2I—2I, respectively, shown in FIG. 2G. The photoresist used to form gate contact pad is then removed. The oxide region 207 may also be removed if desired, but this is not necessary.

Figure 2L:
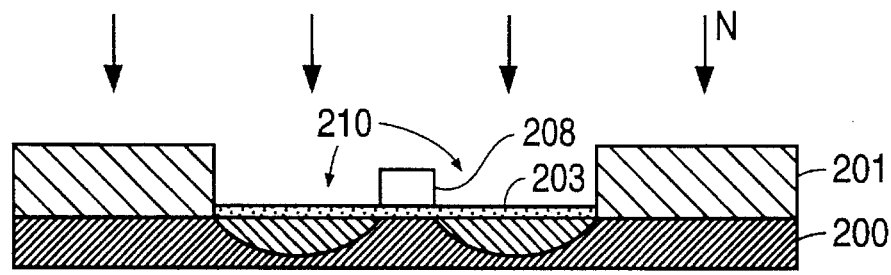

Next, as shown in FIG. 2L, source/drain regions 210 are formed in silicon substrate 200 using conventional processes. Singly ionized arsenic atoms may be implanted, for example, at an energy of 20 key and a dosage of 1×10$^{15}$ ions/cm$^2$. The structure is then annealed at 1000° C. for 10 seconds and further annealed at 800° C. for 40 minutes to activate the incorporated dopant and to repair damage to the silicon substrate caused by the implant.

Figure 2M:
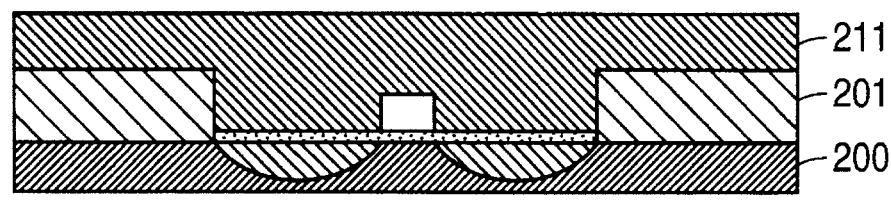
Figure 2N:
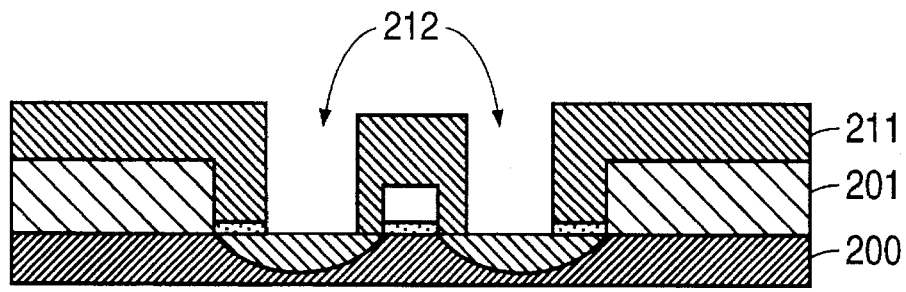
Figure 2O:
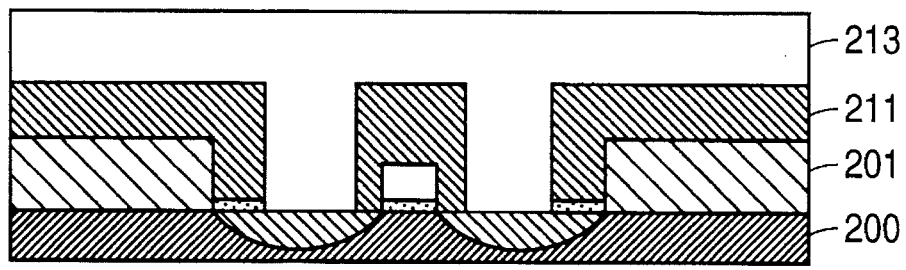
Figure 2P:
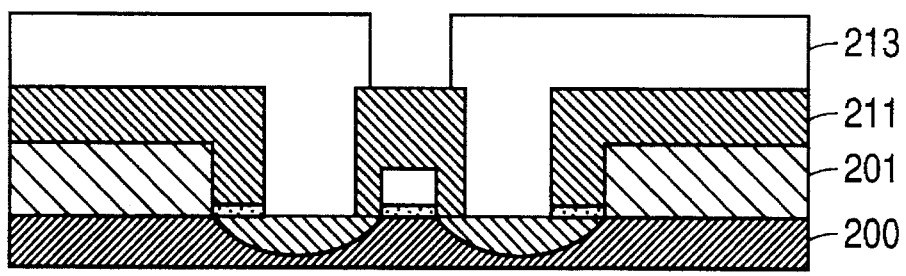
Figure 2Q:
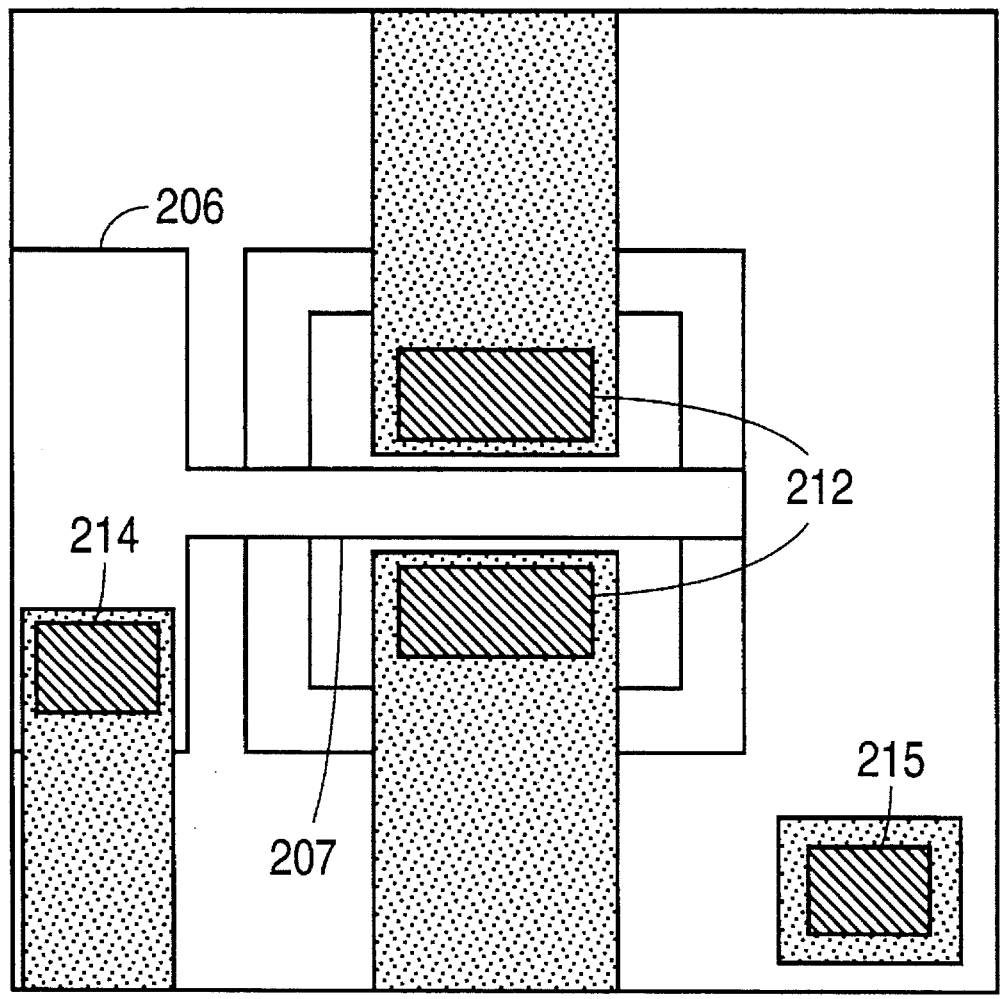

As shown in FIG. 2M, the structure is then covered with a passivation layer 211 which may consist of a combination of low temperature oxide, phosphorosilicate glass and borophosphorosilicate glass. Passivation layer 211 is patterned to open contact holes 212 to source/drain regions 210 (FIG. 2N) and a metal layer 213 which includes aluminum is deposited by sputtering (FIG. 2O) and patterned (FIG. 2P) to form metal contacts either directly to source/drain regions 210 or to a layer of metal silicide (e.g., titanium silicide ($TiSi_2$), tungsten silicide ($WSi_2$) or platinum silicide ($PtSi_2$)), which is formed on top of the source/drain regions 210. Similarly, a contact hole 214 is opened to the gate contact pad 206 and a contact hole 215 is opened to the silicon substrate 204. FIG. 2Q shows a plan view of this structure. Metal layer 213 may also include aluminum alloyed with silicon, titanium, tungsten, copper, chromium, hafnium or tantalum.

Numerous alternatives of the foregoing process are feasible. For example, instead of using a thermal process to form the gate oxide (FIG. 2C), the gate oxide could be formed by scanning the tip over the silicon substrate. The electric field at the tip desorbs the passivating layer on the silicon surface and allows for oxidation of the region scanned. In this way, an extremely thin, uniform gate oxide layer may be formed at room temperature, thereby eliminating many of the variations associated with a high temperature oxidation process. Moreover, the gate oxide may be tested immediately after growth for both electrical thickness and actual thickness, using the AFM in its imaging mode. The early detection of the quality and uniformity of gate oxide layers has the potential of dramatically improving the cost and yield of IC devices.

This method of forming an oxide layer could be used to produce other features of an electronic device, such as an insulating layer of a capacitor.

Another variation of the process is to use the scanning tip to form the gate contact region in lieu of the standard photolithography process described above (FIGS. 2E–2G).

Use of a single layer of, for example, amorphous silicon or polysilicon to form a resist requires that the etchants used have high selectively between the single layer and the substrate. Otherwise, the single layer will be etched while the substrate is being patterned and removing the single layer will further etch the substrate.

Resist for SPM Lithography

Figure 7A:
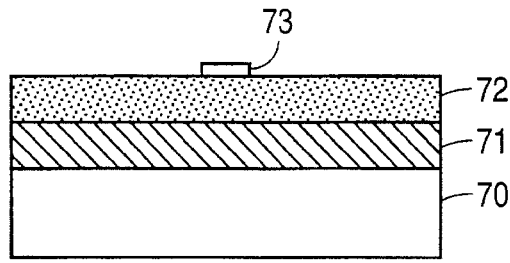
FIGS. 7A–7E illustrate a process of etching a substrate using a two layer resist including an underlayer of polyimide and a top layer of amorphous silicon.

A more general resist for SPM lithography is exemplified by the process illustrated in FIGS. 7A–7E. The starting point, shown in FIG. 7A is a silicon substrate 70, on which a thin layer 71 of polyimide is deposited by spin coating. Polyimide layer 71 is cured in a low temperature bake, and a layer 72 of amorphous silicon is deposited on the top surface of polyimide layer 71. As noted above, amorphous silicon layer 72 may be deposited by chemical vapor deposition (CVD), plasma enhanced chemical vapor deposition (PECVD), sputtering or evaporation. In many situations, PECVD and evaporation are preferable because the amorphous silicon must be deposited over polyimide at low temperatures.

Using methods described elsewhere herein, amorphous silicon layer 72 is exposed to an electric field at the tip of an SPM to form an oxide layer 73 on the surface of amorphous silicon layer 72. The exposure of layer 72 is performed in a pattern that is to be transferred to the substrate 70. Amorphous silicon layer 72 is then etched in a wet or dry etch that is selective against the oxide on the surface, yielding the structure illustrated in FIG. 7B. Wet etches such as KOH, EDP (ethylene diamine and pyrocatechol), or TMAH (tetramethyl ammoniumhydroxide) or dry etches such as reactive ion etch (RIE), plasma etching or ion milling may be used provided that the etch is selective against the oxide on the surface of amorphous silicon layer 72.

Figure 7B:
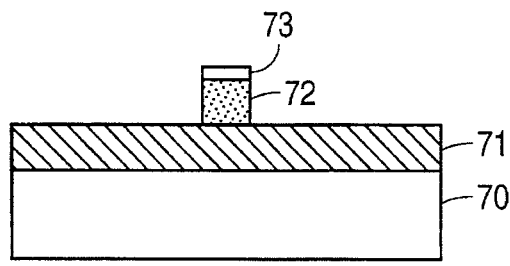
Figure 7C:
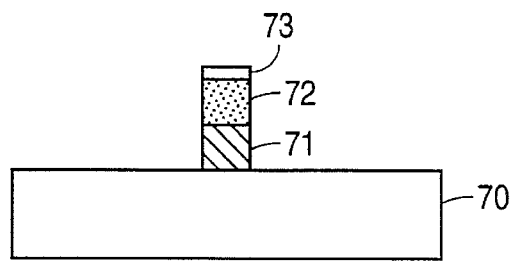

Polyimide layer 71 is then etched, preferably using an oxygen plasma etch. The resulting structure is illustrated in FIG. 7C. The remaining portions of amorphous silicon layer 72 and oxide layer 73 are then removed, yielding the structure illustrated in FIG. 7D, which shows that a portion of the silicon substrate 70 is also etched in this process. This is not a problem provided that the substrate 70 is ultimately to be etched to a greater depth.

Since the selectivity of the etchant used to etch amorphous silicon layer 72 is not perfect, oxide layer 73 is normally completely etched after the pattern has been transferred to amorphous silicon layer 72. If a portion of oxide layer 73 remains at this time, a quick oxide etch may be performed in a 50:1 DI:HF wet etch, or by introducing an oxide-etching gas at the beginning of a dry etch (Freon 23). A 1:1 $SF_6$:Freon 115 plasma at 150 mTorr and 0.22 W/cm² has been found to be capable of simultaneously etching amorphous silicon layer 72 and oxide layer 73.

A portion of polyimide layer 71 now remains on the surface of substrate 70, and this forms a mask for the etching of the substrate. After the pattern has been fully transferred to substrate 70, the remaining portion of polyimide layer 70 is removed using an oxygen plasma etch. The oxygen plasma etch is highly selective against silicon and therefore does not affect the exposed portions of silicon substrate 70.

Figure 7D:
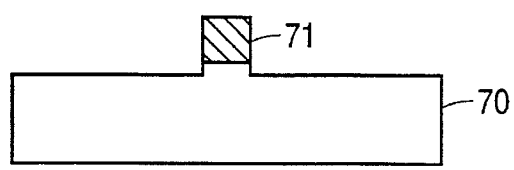
Figure 7E:
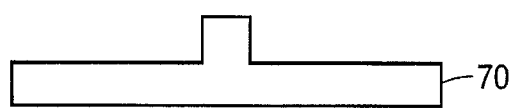

Since etchants which attack silicon are highly selective against polyimide, the etching of silicon substrate 70 can be carried out for an indefinite period without destroying the remaining portion of polyimide layer 71 (FIG. 7D). Moreover, polyimide layer 71 can be made quite thick because there is no danger of etching the amorphous silicon layer 72 when transferring the pattern to the polyimide layer 71.

The process illustrated in FIGS. 7A–7E is illustrative only of the broad principles of this invention. As an alternative to amorphous silicon, any material that oxidizes under the influence of an SPM tip may be used for the top layer, including polysilicon, silicon derivatives (such as silicon dioxide ($SiO_2$), silicon nitride ($Si_3N_4$), oxynitride ($SiO_xN_y$) or hydrogenated or unhydrogenated amorphous silicon with or without added dopants), and metals such as titanium, chromium, aluminum, copper, indium, iridium, iron, manganese, nickel, tantalum, tin and tungsten may also be used. As an alternative to polyimide, other polymers and other organic materials such as photoresist, SAMs (self-assembled monolayers) and Langmuir-Blodgett films may be used for underlayer 71. The material used for underlayer 71 should be able to withstand the processing necessary to deposit top layer 72, and must not etch in etchants used to process the substrate 70. If the processing is performed in a "clean room" the material of underlayer 71 should be compatible with clean room conditions.

Other etchants than oxygen plasma may be used to etch underlayer 71. In many cases, the etchant selected should have a high selectivity against top layer 72 and substrate 70. Possibilities include acids, bases, solvents and other types of plasmas such as TMAH, KOH, $H_2SO_4$:$H_2O_2$ 9:1 at 120° C., ion milling and RIE.

Figure 8A:
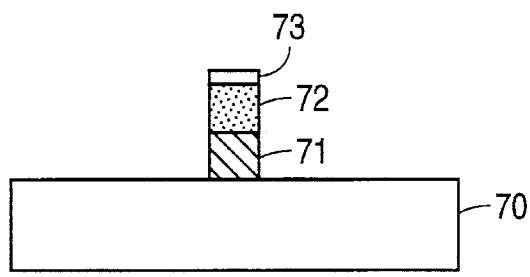
FIGS. 8A–8D illustrate an alternative process of etching the substrate which includes etching the polyimide underlayer to lift off the amorphous silicon top layer.
Figure 8B:
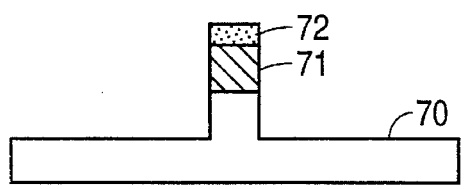
Figure 9B:
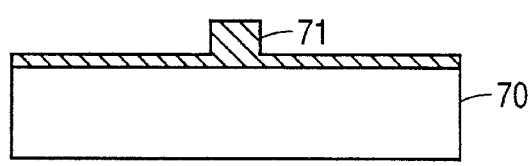
Figure 8C:
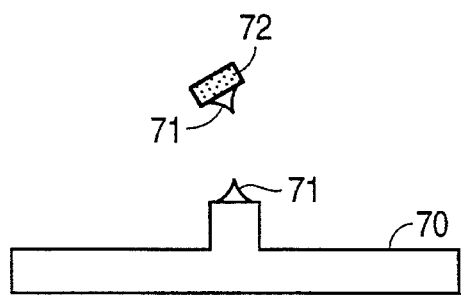
Figure 8D:

A slightly different process may be desirable if substrate 70 is to be etched less than is necessary to remove amorphous silicon layer 72 and oxide layer 73 (the step shown in FIGS. 7C and 7D). One alternative is illustrated in FIGS. 8A–8D. FIG. 8A shows the structure at the same stage shown in FIG. 7C. Substrate 70 is then etched to the extent necessary, leaving a portion of amorphous silicon layer 72 in place. The resulting structure is illustrated in FIG. 8B. Next, polyimide layer 71 is anisotropically etched, preferably using a wet etchant such as TMAH, KOH or $H_2SO_4$:$H_2O_2$ 9:1 at 120° C. This undercuts the remaining portion of amorphous silicon layer 72 causing it to lift off as shown in FIG. 8C. The remainder of polyimide layer 71 is then etched from substrate 70, leaving the structure shown in FIG. 8D.

Figure 9A:
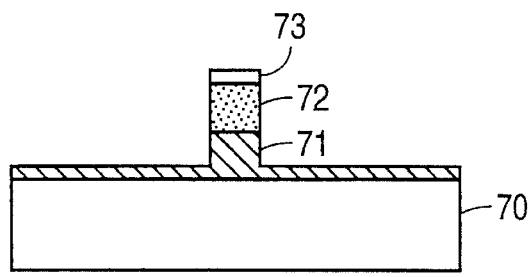
FIGS. 9A–9D illustrate another alternative process for etching the substrate which includes a partial etch of the polyimide underlayer.
Figure 9C:
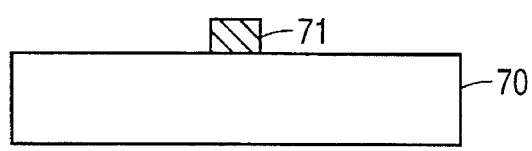
Figure 9D:
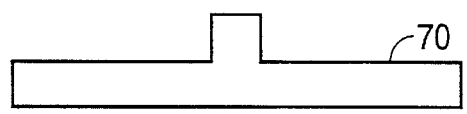

A second alternative is illustrated in FIGS. 9A–9D. After amorphous silicon layer 72 and oxide layer 73 have been etched (as shown in FIG. 7B), polyimide layer 71 is partially etched, preferably such that more than 50% but less than 100% of its thickness is removed. This is illustrated in FIG. 9A. The remaining portions of amorphous silicon layer 72 and oxide layer 73 are then completely etched, the remaining thin portion of polyimide layer 71 providing protection for substrate 70. Polyimide layer 71 is then etched, preferably by exposure to an oxygen plasma, until the thin portion of polyimide layer 71 is removed. The remaining portion of polyimide layer 71, shown in FIG. 9C, forms a mask for the etching of substrate 70. Substrate 70 may be etched to any desired extent with the remainder of polyimide layer 71 acting as a mask. The resulting structure is shown in FIG. 9D.

The foregoing embodiments have described a resist that is "negative" in the sense that the substrate is etched in areas that do not underlie the portion of the amorphous silicon resist layer that are exposed with the SPM tip. In many situations it is desirable to use a positive resist to form tiny trenches or furrows in the substrate. FIGS. 10A–10E illustrate a process which uses SPM tip lithography to form a trench in the substrate.

A thin layer 91 of titanium is deposited on a silicon substrate 90 in a vacuum or oxygen-free environment. This is done to prevent the titanium from oxidizing, which it would do very rapidly if exposed to oxygen. A layer 92 of amorphous silicon is immediately deposited on the surface of titanium layer 91. The structure can then be removed from the oxygen-free environment, since amorphous silicon layer 92 will prevent titanium layer 91 from oxidizing. Titanium layer 91 and amorphous silicon layer 92 are preferably deposited using electron-beam evaporation.

Figure 10A:
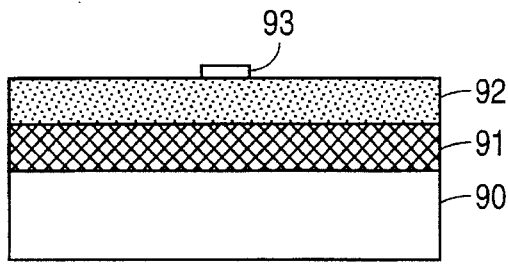
FIGS. 10A–10E illustrate a process of forming a trench in a substrate using a "positive" resist which includes a titanium underlayer and an amorphous silicon top layer.
Figure 10B:
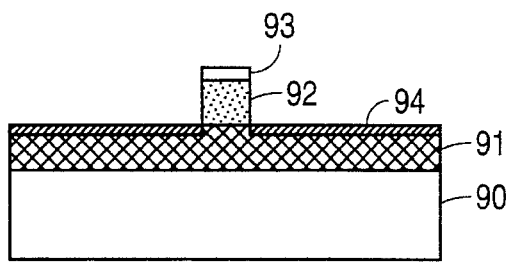

The top surface of amorphous silicon layer 92 is then exposed with an SPM tip to form an oxide layer 93, yielding the structure illustrated in FIG. 10A. Next, amorphous silicon layer 92 is etched, using oxide layer 93 as a mask. As shown in FIG. 10B, an oxide layer 94 forms on the surface of titanium layer 91 as soon as it is exposed to air.

Figure 10C:
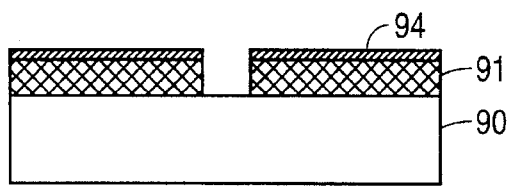
Figure 10D:
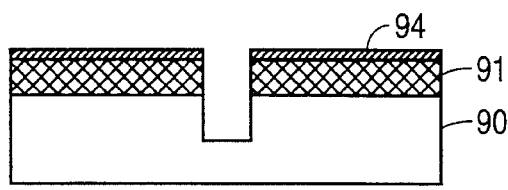

As shown in FIG. 10C, the structure is then etched in a plasma which attacks both amorphous silicon layer 92 and titanium layer 91, but attacks oxide layer 94 much more slowly. This etch is preferably performed in a 1:1 $SF_6$:$CF_3Br$ plasma at 150 mTorr and 0.81 W/cm². As a result, the amorphous silicon layer 92 and unoxidized titanium beneath it are etched away whereas the oxidized portions of titanium layer 91 remain. The resulting structure is shown in FIG. 10C.

Figure 10E:
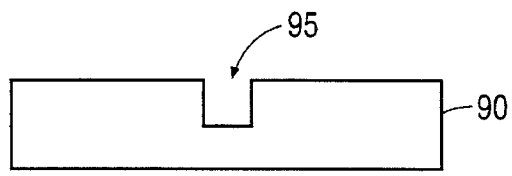

The substrate 90 is then etched with a 1:1 $SF_6$:Freon 115 plasma at 150 mTorr and 0.22 W/cm², using the remaining portion of titanium layer 91 and oxide layer 94 as a mask. This yields the structure shown in FIG. 10D. The oxidized titanium mask (titanium layer 91 and oxide layer 94) is then removed in a titanium etch that has a high selectivity against silicon substrate 90. An HF or similar titanium etch may be used. The resulting trench 95 is illustrated in FIG. 10E.

If substrate 90 were composed of a dielectric (e.g., an oxide or nitride), then substrate 90 could be etched using RIE at a DC bias of −530 V and a power density of 0.95 W/cm² or a gas mixture of 14.2:1 Freon 23:$O_2$ at a pressure of 250 mTorr. If substrate 90 were organic, an oxygen plasma etch could be used. The titanium mask could be stripped in the plasma etch described above.

Structure of Cantilever

Figure 3A:
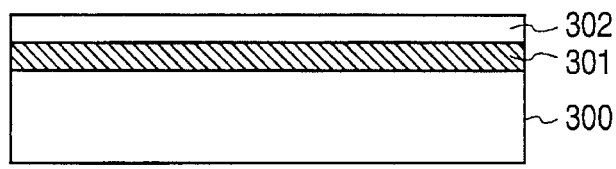

In some embodiments, it is desirable to use a cantilever which has an element for detecting the bending of the cantilever and an element which causes the cantilever to bend. This enables the system to maintain a constant force between the tip of the cantilever and the surface with which it is in contact, and also may allow the cantilever to be lifted from the surface. Also, as described above, the cantilever preferably has a conductive path which may be used to connect a voltage source to the tip of the cantilever. FIGS. 3A–3AA illustrate a process of fabricating such a cantilever. It will be apparent that FIGS. 3A–3AA are not drawn to scale, the vertical axis being expanded to allow the various layers of the cantilever to be clearly shown.

Figure 3B:
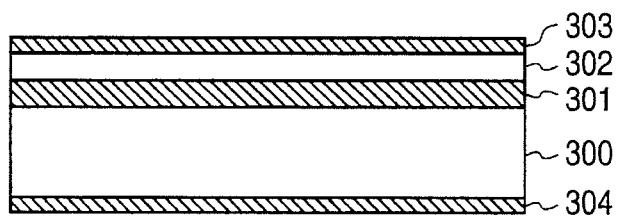
Figure 3C:
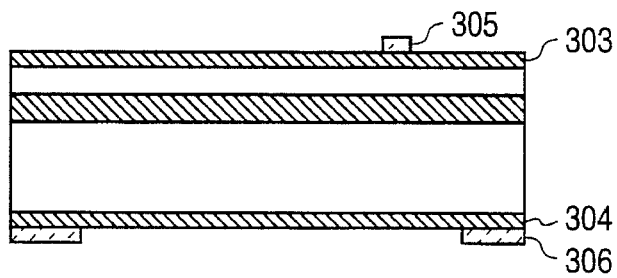
Figure 3D:
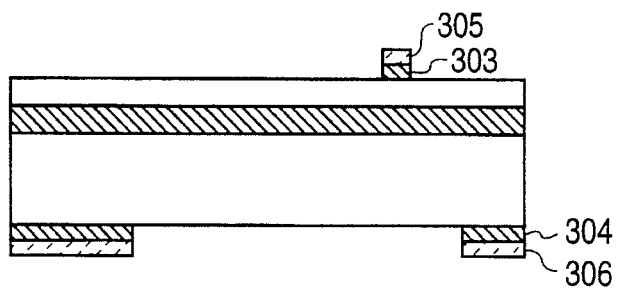

The starting point is a <100> silicon-on-insulator (SOI) wafer which includes a silicon substrate 300, a middle oxide layer 301 and a top silicon layer 302. In a preferred embodiment, silicon substrate 300 is 450 µm thick, middle oxide layer 301 is 1 µm thick, and top silicon layer 302 is 10 µm thick. As shown in FIG. 3B, oxide layers 303 and 304, preferably 1 µm thick, are grown on the top and bottom of the structure. This may be accomplished by wet oxidation at 1100° C. for 2 hours and 25 minutes. As shown in FIGS. 3C and 3D, oxide layers 303 and 304 are patterned with photoresist layers 305 and 306 and etched. The etching process may be performed in a 6:1 buffered oxide etch (BOE) solution for ten minutes.

Figure 3E:
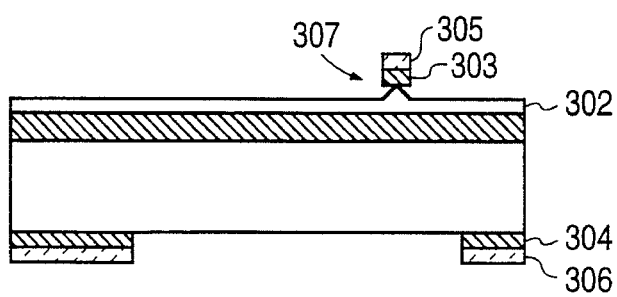
Figure 3F:
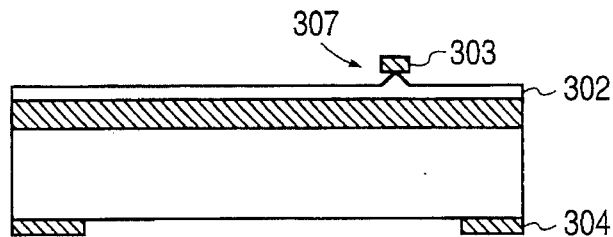
Figure 3G:
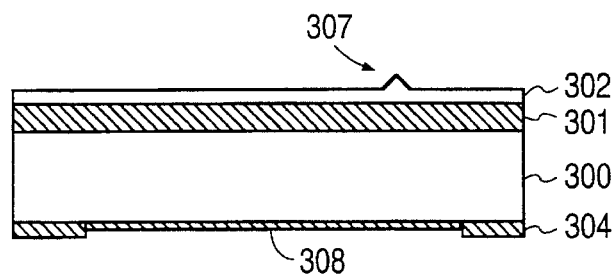

As shown in FIGS. 3E and 3F, top silicon layer 302 is etched, forming a tip 307 beneath the remains of oxide layer 303 and photoresist layer 305, and photoresist layers 305 and 306 are stripped. Top silicon layer 302 is then repeatedly oxidized and etched to sharpen tip 307. This may be accomplished by growing a wet oxide at 950° C. for 40 minutes and etching the oxide layer. This process also forms a new oxide layer 308 on the bottom of the structure having a thickness of about 0.79 µm.

Figure 3H:
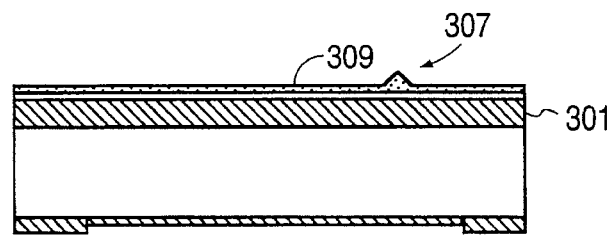
Figure 3I:
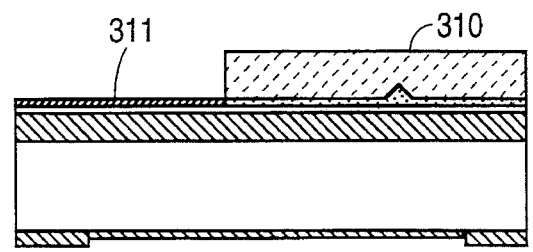
Figure 3J:
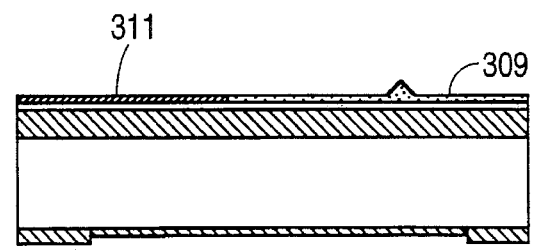

As shown in FIG. 3H, the top surface of the structure is implanted with P-type dopant to form a piezoresistor 309 which extends to the tip 307. This is preferably accomplished with boron ions at a dosage of $5\times10^{14}$ cm$^{-2}$ and an energy of 80 keV. As shown in FIG. 3I, the top surface of the structure is then patterned with a thick photoresist layer 310 that protects the tip 307, and a P-type dopant is implanted to form a P+ conductive region 311. Photoresist layer 310 is preferably AZ4620 photoresist. The implantation of the P-type dopant is accomplished with boron ions at a dosage of $5\times10^{16}$ cm$^{-2}$ at an energy of 80 keV. Thus the first P-type implantation described in FIG. 3H forms a piezoresistor, and the second P-type implantation described in FIG. 3I forms a conductive element. Photoresist layer 310 is then stripped, as shown in FIG. 3J, leaving the piezoresistor 309 and the conductive region 311. FIG. 3J1 is a plan view showing the shape of piezoresistor 309 and conductive region 311. Cross section line 3J—3J shows the section at which the view of FIG. 3J is taken.

Figure 3K:
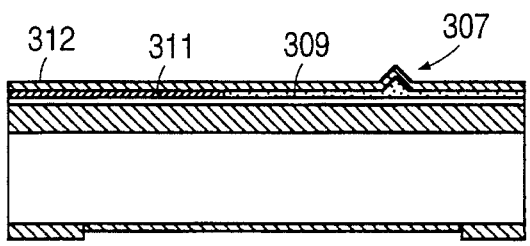
Figure 3L:
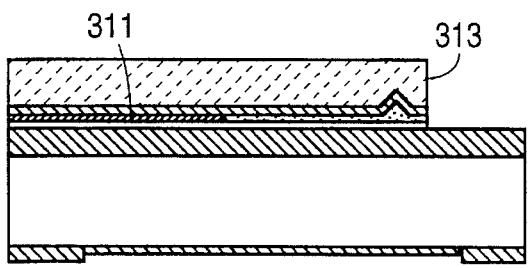

Next, as shown in FIG. 3K, a thin oxide layer 312 is grown on the top surface of the structure. Oxide layer 312 may be grown by a wet process at 900° C. for ten minutes to achieve a thickness of 270 Å. If desired, oxide layer 312 may be removed from the region of the tip 307 in an additional photolithographic step.

Figure 3M:
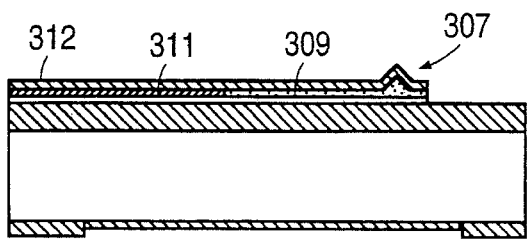
Figure 3N:
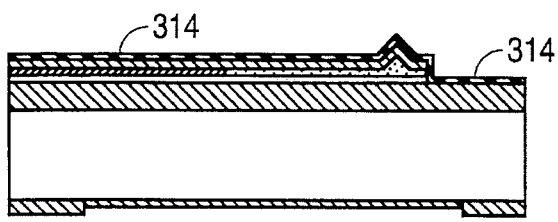

A photoresist layer 313 is deposited to define a cantilever, and oxide layer 312 and top silicon layer 302 are etched to form a cantilever 316. Photoresist layer 313 is then removed (FIG. 3M). The shape of cantilever 316 is illustrated in the plan view of FIG. 3M1, with the tip 307 being located near the point of the cantilever 316 and conductive region 311 and piezoresistor 309 forming a conductive path which includes tip 307. Cross section line 3M—3M indicates the section at which FIG. 3M is taken.

Figure 3O:
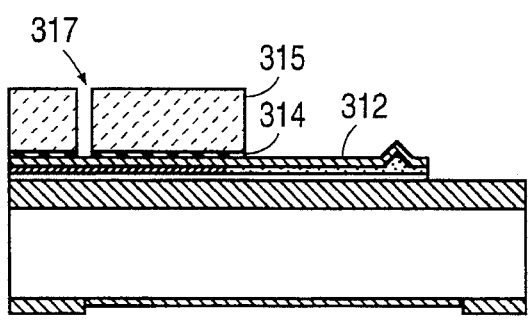
Figure 3P:
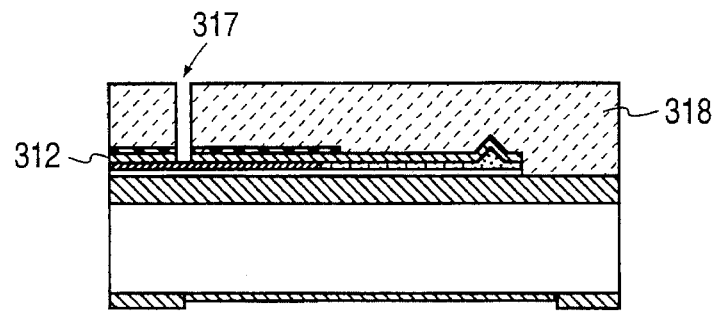

A nitride buffer layer 314 is deposited over the top surface of the structure. Buffer layer 314 is preferably a low stress PECVD nitride layer about 0.2 μm thick. A photoresist layer 315 is then deposited on top of buffer layer 314 and buffer layer 314 is etched so as to form a contact region 317. This step is illustrated in FIG. 3O. Photoresist layer 315 is preferably an AZ4620 photoresist, and an RIE (reactive ion etch) process is used to etch nitride buffer layer 314.

Photoresist layer 315 is stripped, and a new photoresist layer 318 is deposited so as to expose oxide layer 312 in contact region 317. Photoresist layer 318 is preferably AZ4620 photoresist. Oxide layer 312 is then etched, preferably using a 6:1 BOE solution for two minutes. Photoresist layer 318 is then stripped.

Figure 3Q:
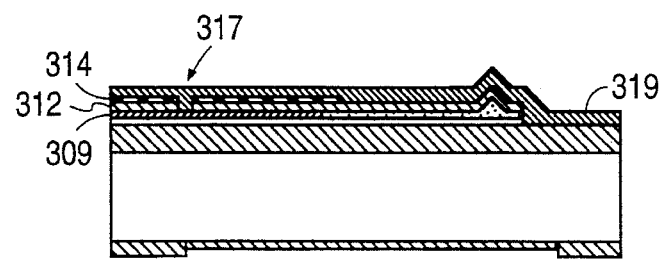

A first metal layer 319 is then deposited over the entire surface of the structure, filling contact region 317 and establishing a contact with conductive region 311. This step is illustrated in FIG. 3Q. First metal layer 319 is preferably formed by evaporating aluminum to a thickness of 0.5 μm on a cold substrate.

Figure 3R:
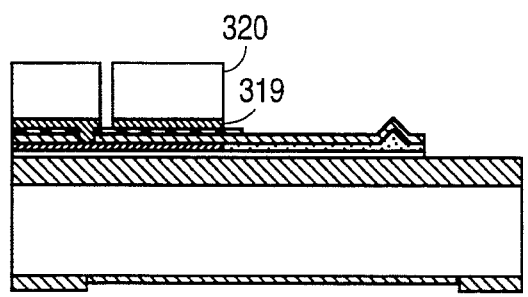

A photoresist layer 320 is deposited and first metal layer 319 is etched, as shown in FIG. 3R. In the preferred embodiment, the aluminum layer which forms first metal layer 319 is etched by a wet process. A plan view of first metal layer 319 is shown in FIG. 3R1, which indicates the location of contact region 317 and a second contact region 317A formed opposite contact region 17. FIG. 3R is taken through the section line designated 3R—3R in FIG. 3R1.

Figure 3S:
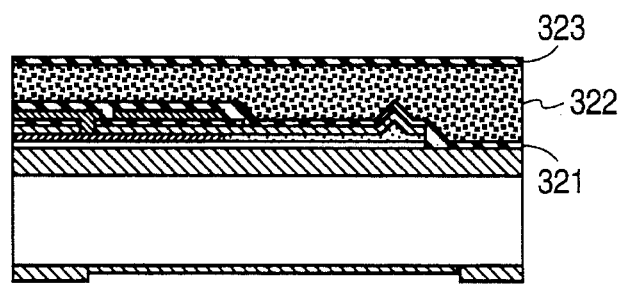

Referring next to FIG. 3S, after photoresist layer 320 has been stripped, a 0.2 μm thick PECVD nitride buffer layer 321, a 3.5 μm thick ZnO layer 322, and a 0.2 μm thick PECVD nitride buffer layer are deposited in succession over the top surface of the structure. The sandwich of ZnO layer 322 and nitride buffer layers 321 and 323 will form a piezoelectric element as described below. A pair of terminals 319T form an electrical contact to the bottom electrode of the piezoelectric element.

Figure 3T:
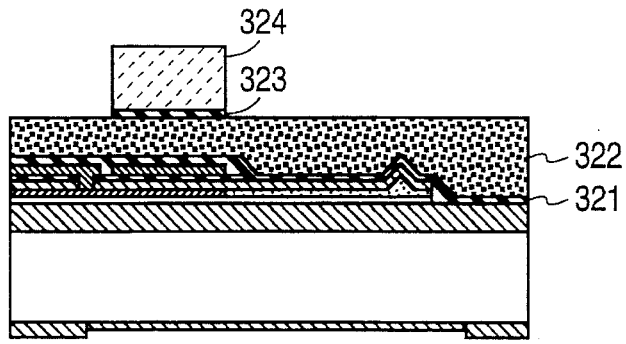
Figure 3U:
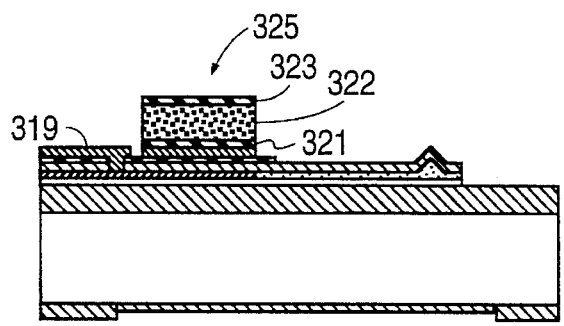

A thick photoresist layer 324 (preferably AZ4620) is then deposited and nitride buffer layer 323 is etched using an RIE etch. The resulting structure is shown in FIG. 3T. Using buffer layer 323 as a mask, ZnO layer 322 is then etched, and nitride layer 321 is RIE etched. After photoresist layer 321 is stripped in an oxygen plasma, the structure shown in FIG. 3U emerges. FIG. 3U1 is a plan view of ZnO layer 322, with the cross section line 3U—3U denoting the section at which FIG. 3U is taken.

Figure 3V:
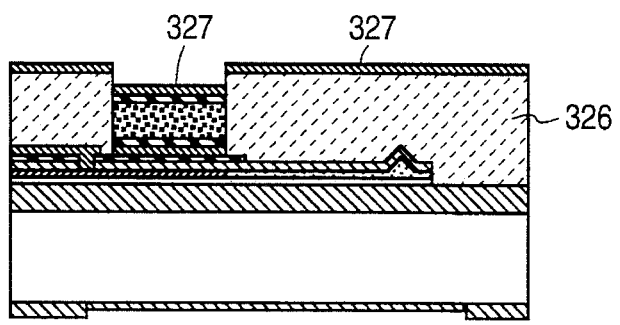

A photoresist layer 326 is then deposited as shown in FIG. 3V. Photoresist layer 326 is preferably a chlorobenzene treated AZ4620 photoresist. A second metal layer 327 is then deposited on the top surface of the structure, second metal layer 327 preferably being aluminum which is evaporated to a thickness of 0.5 microns. Photoresist layer 326 is then etched, lifting off a portion of second metal layer 327 and yielding the structure shown in FIG. 3W. As is evident from FIG. 3W, first metal layer 319 and second metal layer 325 form the bottom and top electrodes, respectively, of the ZnO piezoelectric element 325.

Figure 3W:
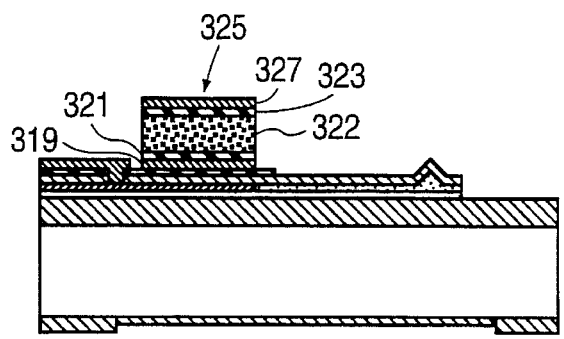

FIG. 3W1 is a top view of the structure at this point, with cross section line 3W—3W indicating the section at which FIG. 3W is taken. As is apparent from FIG. 3W1, second metal layer 327T extends to the sides of the structure in the region beyond the base of the cantilever 316. In these regions, ZnO layer 322 (FIG. 3U1) merely acts as an insulating layer beneath second metal layer 325. A terminal 325T forms an electrical contact to the top electrode of piezoelectric element 325. A third metal layer (not shown) is then deposited on contact regions 317 and 317A, terminals 319T and terminal 327T to increase the thickness of the aluminum in these areas to at least 1.0 μm.

Figure 3X:
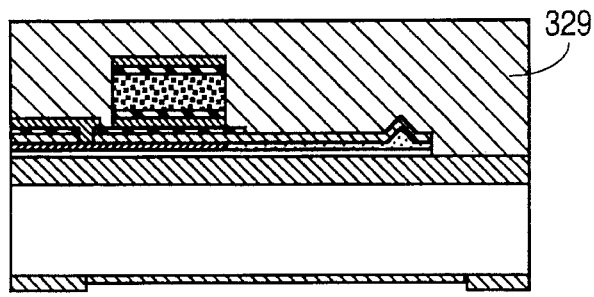
Figure 3Y:
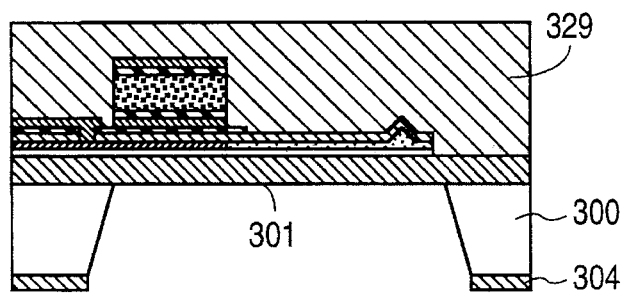

Next, as shown in FIG. 3X, a thick layer of PIQ 3600 polyimide (available from Hitachi) is spun on the top surface of this structure, preferably for 2 minutes at 500 RPM. The structure is then baked for 2 hours at 350° C. The bottom surface of the structure is then etched using an ethylene diamine and pyrocatechol (EDP) etch at 105° C., as shown in FIG. 3Y. EDP can be purchased as a premixed anisotropic silicon etchant. Other etchants such as tetramethyl ammonium hydroxide (TMAH) or hydrazine may also be used. The etchant used should be anisotropic and be highly selective against silicon dioxide and must not interfere with the circuitry. The result is to remove a portion of silicon layer 300, exposing the bottom surface of oxide layer 301.

Figure 3Z:
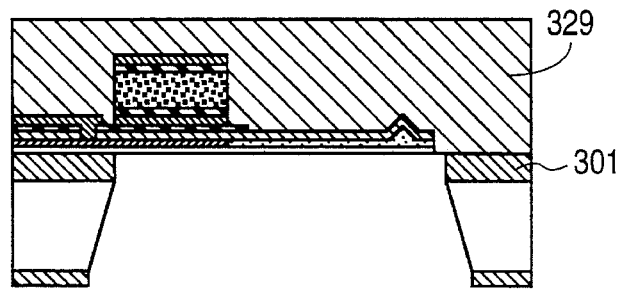
Figure 3A:
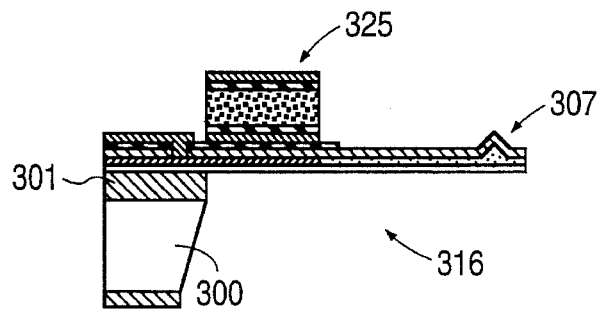

Oxide layer 301 is then etched, preferably with a 6:1 BOE solution. This yields the structure shown in FIG. 3Z. Finally, polyimide layer 329 is removed freeing the cantilever 316 as shown in FIG. 3AA.

For maximum efficiency, an array of cantilevers may be formed in each die of a wafer as described in Application Ser. No. 08/296,340, now abandoned. As described there, each cantilever projects into a "window" in the die. The wafer containing the cantilevers is then juxtaposed to a wafer on which the transistors are to be fabricated.

Control Circuitry

Figure 5A:
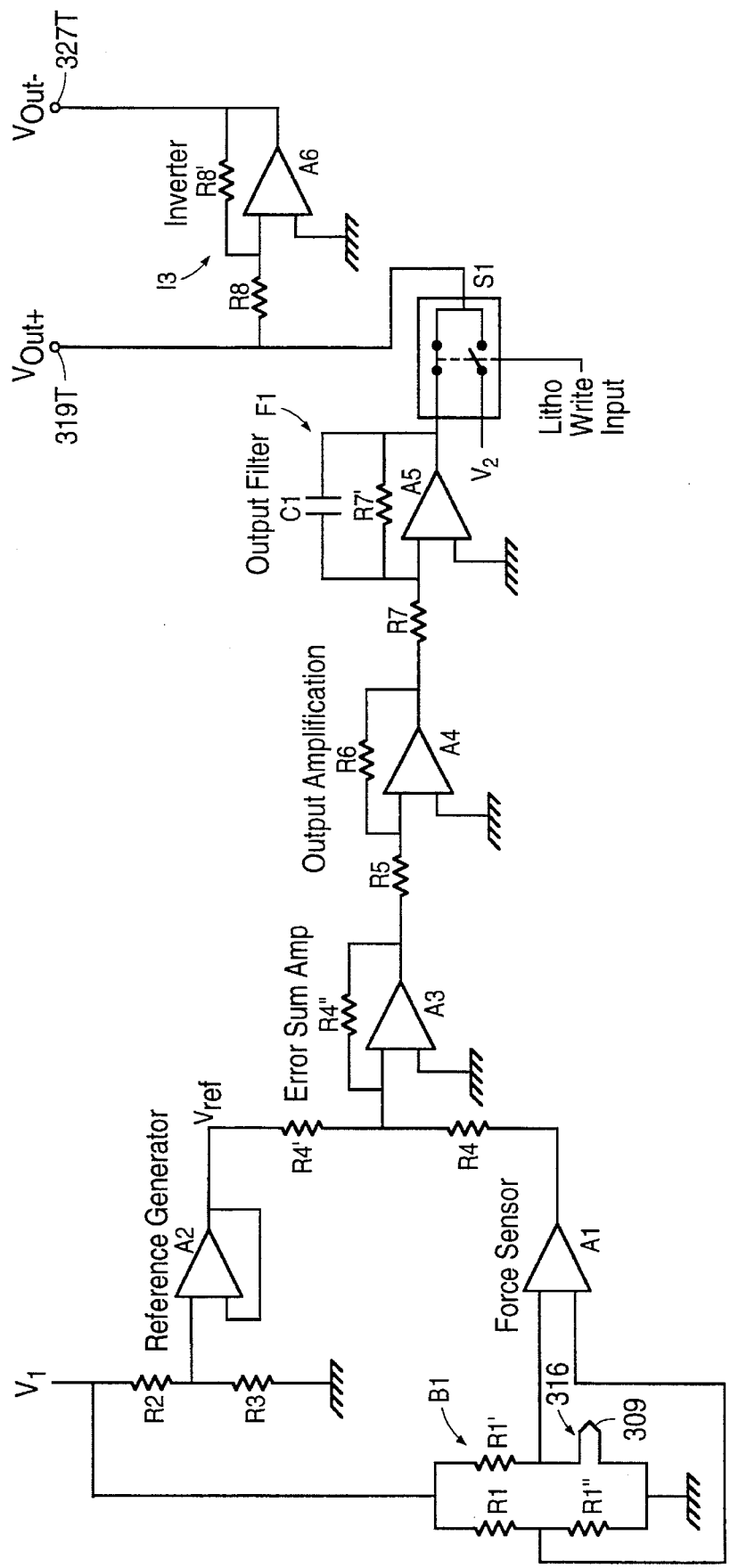
FIGS. 5A and 5B illustrate circuitry for controlling a cantilever of the kind shown in FIG. 1.
Figure 5B:
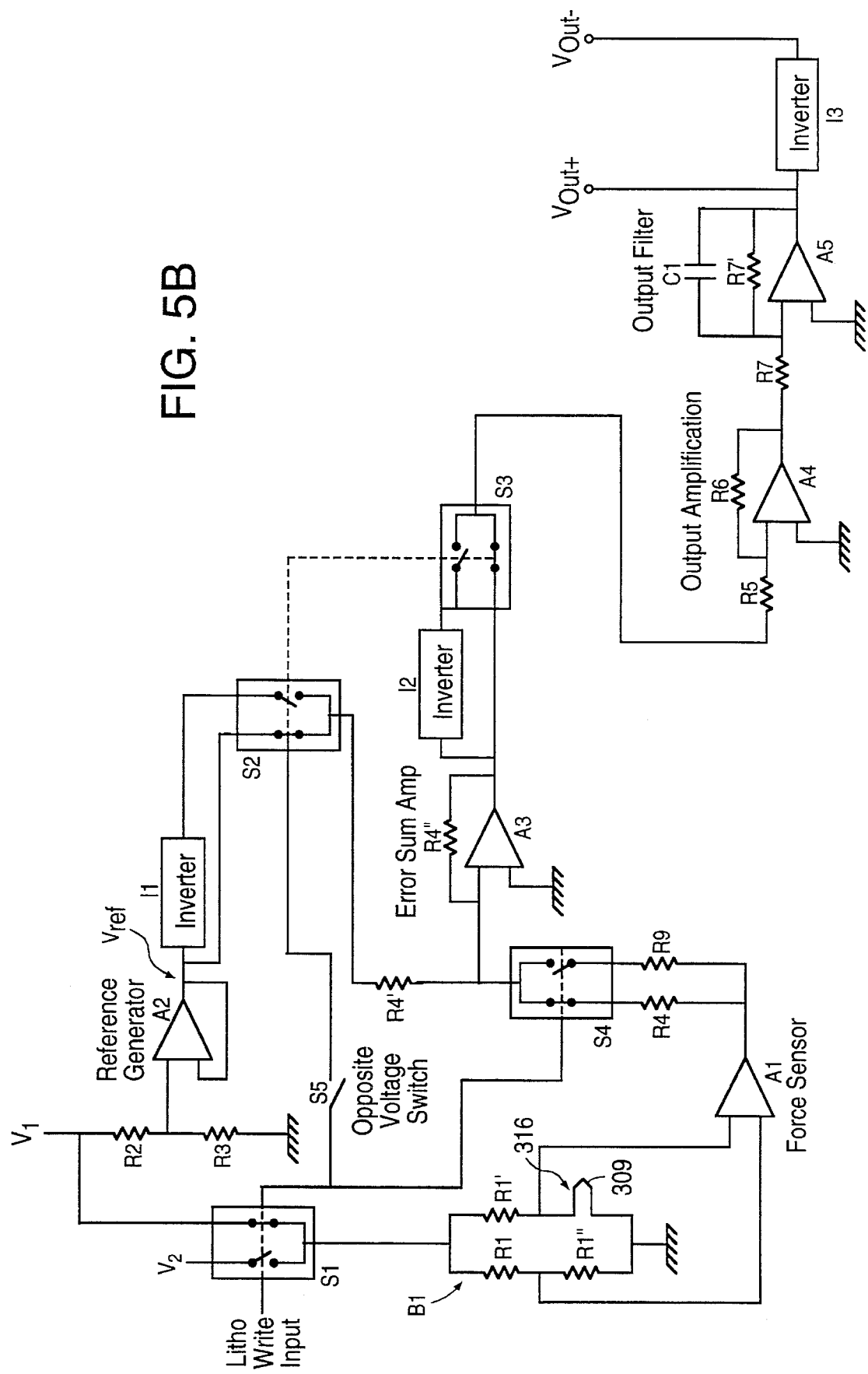

FIGS. 5A and 5B illustrate in schematic form the circuit that is used to control cantilever 316 during the lithographic process. It should be understood that the components illustrated in FIGS. 5A and 5B are fabricated in integrated form on board the wafer, with a corresponding control circuit being used to control separately each cantilever in the array. The manner of fabricating the individual components in FIGS. 4A and 4B in integrated circuit form is well known to those skilled in the art and will not be described here.

FIG. 5A illustrates a control circuit that is used to interrupt the write process (i.e., the exposure of the silicon by an electric field) by lifting the cantilever away from the surface. In this manner, the electric field ceases and the oxidation of the silicon is terminated. Piezoresistor 309 is connected in a bridge circuit B1 which is supplied by a constant voltage $V_1$. The bridge circuit includes resistors R1, R1' and R1" each of which is precision matched to piezoresistor 309. The value of resistors R1, R1' and R1" are set such that the voltage at the tip of the cantilever is equal to $V_1/4$. The outputs of the bridge circuit B1 are delivered to respective inputs of an amplifier A1, which is a high precision, high gain, low noise, operational amplifier. The voltage $V_1$ is also supplied to a voltage divider consisting of resistors R2 and R3, which are set to provide a voltage which is passed through a high precision operational amplifier A2 to provide a reference voltage $V_{ref}$. In FIGS. 4A and 4B, the resist layer and substrate are at system ground potential.

The outputs of amplifiers A1 and A2 are passed through matched resistors R4 and R4' respectively, to the input of an error sum amplifier A3, which provides a unity gain. A precision operational amplifier A4 amplifies the output of error sum amplifier A3, the gain being determined by resistors R5 and R6.

The signal is then passed through a low pass filter F1 which includes a capacitor C1, an operational amplifier A5, and resistors R7 and R7'. Amplifier A5 is an integrating operational amplifier which filters out high frequencies in order to maintain stability in the feedback loop while at the same time enhancing the feedback loop by using previously acquired information to "predict" new information (the feedback loop in this case includes the piezoelectric element 325, the operation of which affects the resistance of piezoresistor 309.) The integrator gain of amplifier A5, which determines the slope of changes in the output, is equal to $1/(R7 \times C1)$. The resistors R7 and R7' are set at the same value to keep the magnitude gain constant. (The magnitude gain is set in amplifier A4.) Therefore, capacitor C1 determines the integrator gain. If the value of C1 is increased, the integrator gain is decreased, causing amplifier A5 not to respond to frequencies above the gain (1/RC). Filtering of the high frequencies makes the feedback loop more stable but less sensitive. To enhance sensitivity, the integrator gain should be set as high as possible without making the feedback loop become unstable. Other factors which contribute to the maximum integrator gain are the scan speed, the gain of amplifier A4, and the topology of the imaged surface.

The output of filter F1 is passed through a double-pole switch S1 and to a pair of outputs $V_{out+}$ and $V_{out-}$. An inverter I3, containing an amplifier A6 and resistors R8 and R8' ensures that $V_{out-}$ has the same absolute magnitude but opposite sign as $V_{out+}$. $V_{out+}$ and $V_{out-}$ are delivered to terminals 319T and 327T shown in FIG. 3W1, which, as described above, are the poles of the piezoelectric element 325.

The other current path through switch S1 is connected to a constant voltage $V_2$. The voltage $V_2$ is set at a level such that when $V_{out+}=V_2$ and $V_{out-}=V_2$ the cantilever is bent away from the surface of the substrate. The lithographic write input is connected to switch S1 and, when activated, connects the output of filter F1 to terminals 319T and 327T.

When the cantilever is writing, the resistance of piezoresistor 309 varies as the cantilever flexes. Bridge circuit B1 therefore delivers varying outputs to amplifier A1. Error sum amplifier A3 compares the output of amplifier A1 against the reference voltage $V_{ref}$ and transmits the signal for amplification to amplifier A4. High frequency components of the signal are filtered by filter F1 and the resultant signal and its inverse are delivered to terminals 319T and 325T as $V_{out+}$ and $V_{out-}$. $V_{out+}$ and $V_{out-}$ are used for imaging purposes and also to control the piezoelectric element 325 so as to maintain a constant force between the tip 307 and the surface of the substrate. Thus, with switch S1 in this position, the cantilever operates in the manner of a conventional atomic force microscope.

As noted above, the voltage at the tip 307 is equal to $V_1$ divided by 4. $V_1$ is set such that $V_1/4$ is above the threshold (voltage that is required) to establish an electric field which causes silicon dioxide to form at the point where tip 307 makes contact with the surface of the silicon. To perform lithography by oxidation, the tip is normally negatively biased with respect to the silicon, and $V_1$ might be set at −28V, for example.

Figure 6:
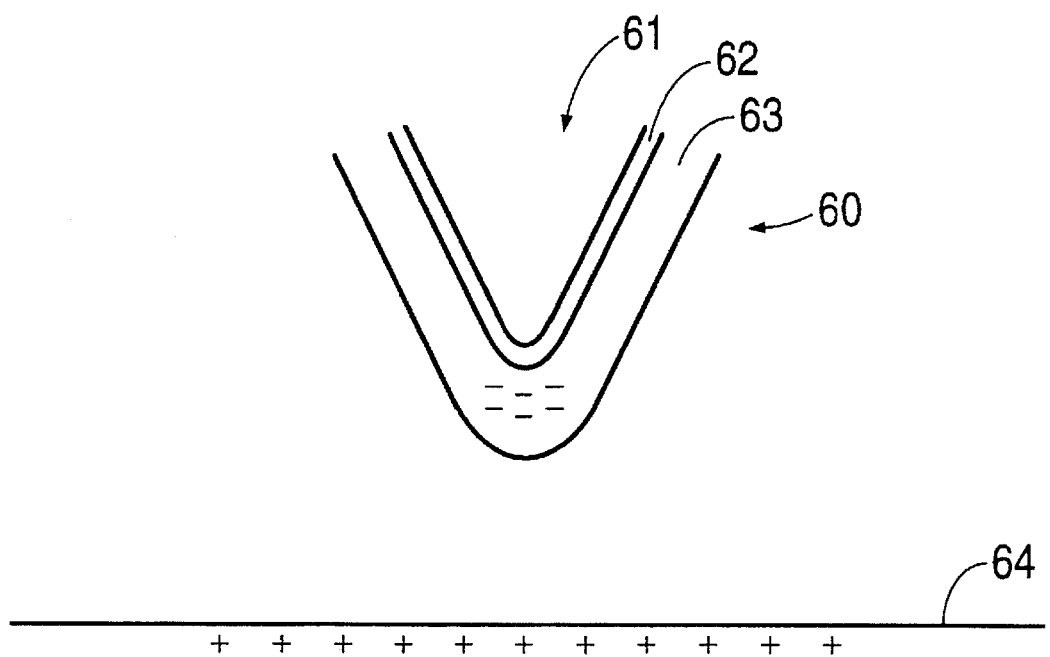
FIG. 6 illustrates a detailed cross-sectional view of a cantilever tip on which an electrical charge is stored.

The control circuit shown in FIG. 5A may also be used to perform electric field lithography using charge trapped at the apex of the cantilever tip. FIG. 6 illustrates a detailed cross-sectional view of a cantilever tip 60. An underlying silicon tip 61 is covered by an oxide layer 62 and a nitride layer 63. Negative charge is trapped in the nitride layer 63 and produces an electric field between cantilever tip 60 and a substrate 64. This electric field may be used to perform lithography as described above.

The nitride-oxide-silicon (NOS) structure at the tip shown in FIG. 6 may be formed by depositing 50 Å of thermal oxide followed by 450 Å of silicon-nitride onto the bare silicon tip 61. The thermal oxide may be deposited at 800° C. for 30 minutes in dry oxygen, and the nitride may be deposited by a low pressure chemical vapor deposition process. Oxide layer 62 and nitride layer 63 may be deposited at any time after tip 61 has been sharpened and the piezoresistor has been implanted, as described above, but before the cantilevers are freed in the backside etch (FIG. 13Y). Preferably, this is done immediately after the tip is sharpened (FIGS. 10H and 10I). Oxide layer 62 and nitride layer 63 are deposited on the exposed cantilever and are removed from regions such as the contacts, piezoresistor and electrical circuitry where their presence might create a problem.

Nitride layer 63 is charged by placing it in contact with a conductor and creating a large bias (e.g., 25–40 volts) between the conductor and silicon tip 61. This bias causes charge from the silicon tip 61 to tunnel through the oxide layer 62 and become trapped in the nitride layer 63. Once the charge has been trapped in the nitride layer 63, the bias can be removed and the charge will remain fixed.

In one application, after the cantilevers were completely fabricated the tips were brought into contact with a conducting substrate. A bias, either DC or pulse, was then applied to the conducting substrate to trap charge in the tips. The die, from which the cantilevers are electrically isolated, was grounded, and the tip and cantilever were allowed to "float" electrically.

The bias needs to be applied only for several seconds, although it could be applied for longer. After the bias is removed and the cantilevers are taken away from the conducting substrate, the cantilevers are ready for lithography. This process can be repeated as necessary to replace any charge that leaks from the nitride layer.

This embodiment eliminates the need for a conductive path to the tip (see e.g., conductive path 201 in FIG. 12). Lithography is performed by causing the cantilever to which tip 60 is attached to bend away from the substrate 64, as described above, using the circuitry shown in FIG. 5A.

FIG. 5B shows a control circuit that is used to perform lithography by controlling the bias of the tip. Many of the components shown in FIG. 5B are the same as those shown in FIG. 5A and are similarly designated. In FIG. 5B, switch S1 is connected such that $V_1$ is applied to the bridge B1 when the switch is in one position and $V_2$ is applied to bridge B1 when the switch is in the other position. Switch S1 is ganged with a switch S4 and through a manually operated, opposite voltage switch S5 with switches S2 and S3. Opposite voltage switch S5 is closed when $V_1$ and $V_2$ have opposite signs and open when they have the same sign.

Switch S2 allows the output of amplifier A2 to be passed through an inverter I1 before it is delivered through resistor R4' to an input of error sum amplifier A3. Switch S3 allows the output of error sum amplifier A3 to be inverted before it is passed to an input of amplifier A4. Switch S4 allows the output of amplifier A1 to be passed through a resistor R9 to an input of error sum amplifier A3. The value of resistor R9 is set such that the following relationship holds:

$$\frac{R4}{R9} = \frac{V_1}{V_2}$$

The operation of this circuit will be described first in the situation where $V_1$ and $V_2$ have the same polarity (i.e., the opposite voltage switch S5 is open). In this condition, switches S2 and S3 are in the state shown in the drawing (i.e., inverters I1 and I2 are not operative). $V_2$ is set such that $V_2/4$, which is the voltage at the tip, exceeds whatever threshold voltage is required to cause lithography to be performed. Typically, lithography by oxidation takes place with the tip biased negatively with respect to the substrate. $V_1$ is set such that $V_1/4$ is below the applicable threshold voltage.

When the switches S1 and S4 are in the position shown in FIG. 5B, the circuit operates exactly like the circuit of FIG. 5A in the imaging (non-lithographic) mode. When switch S1 is thrown to connect $V_2$ to the bridge circuit B1, the voltage at the tip exceeds the applicable threshold and lithography is performed. In this situation, switch S4 connects resistor R9 into the circuit between the output of amplifier A1 and the input of amplifier A3. Since, as described above, $$\frac{R_4}{R_9} = \frac{V_1}{V_2},$$

switching $R_9$ into the circuit compensates for the difference between $V_1$ and $V_2$ and ensures that the voltage at the input of amplifier A3 will remain constant. As a result, a consistent signal is delivered to terminals 319T and 327T, assuring that the piezoelectric element 325 receives the same input signal.

When $V_1$ and $V_2$ are of opposite polarity, the opposite voltage switch S5 is closed. With switch S5 closed, the $V_{ref}$ output of amplifier A2 is passed through inverter I1, and this adjusts for the change of polarity at the input of error sum amplifier A3. Similarly, the polarity of the output of amplifier A3 is corrected by passing it through inverter I2. Thus, switches S2 and S3 correct for the difference in polarity between $V_1$ and $V_2$. As described above, switch S4 corrects for the difference in the absolute values of $V_1$ and $V_2$. Again, switches S2, S3 and S4, together assure that the piezoelectric element 325 receives the same input regardless of the state of switch S1.

While specific embodiments according to this invention have been described above, it will be apparent from the foregoing that a wide variety of alternative embodiments could be designed and fabricated without departing from the broad principles of this invention. For example, while the fabrication of a gate of a MOSFET has been described, other features of a field-effect-transistor such as the gate contact region, contact holes, and metal could be fabricated by applying amorphous silicon instead of photoresist, patterning the amorphous silicon in the manner described within this application, using the amorphous silicon as a mask to transfer the pattern onto the underlying material, and removing the amorphous silicon. The underlying, patterned material may be an insulator (e.g., oxide or nitride), a semiconductor (e.g., silicon (Si), silicon germanium (SiGe), gallium arsenide (GaAs), indium phosphide (InP), indium gallium arsenide (InGaAs), indium arsenide (InAs), cadmium sulphide (CdS), or cadmium telluride (CdTe)) or a metal. Moreover, features of electronic devices other than NMOSFETs, including PMOSFETs, CMOSFETs, junction field-effect transistors (JFETs), bipolar junction transistors (BJTs), thin film transistors (TFTs), surrounding gate transistors, depleted lean-channel transistors, single electron transistors, resonant tunneling bipolar transistors (RTBTs), metal-semiconductor field effect transistors (MESFETs), heterostructure field effect transistors (HFETs) and heterojunction bipolar transistors (HBTs), as well as any other device of structure which requires lithography can also be fabricated using the unique features of this invention. Accordingly, it is intended that this invention, as defined in the following claims, cover all such embodiments.

We claim:

1. A method of etching a pattern on a semiconductor substrate, said method comprising:

depositing an underlayer on a surface of said semiconductor substrate;

depositing a top layer on a surface of said underlayer;

creating a pattern in a region at a surface of said top layer with a tip of a cantilever of a scanning probe microscope;

applying a first etchant to said surface of said top layer so as to remove a portion of said top layer, using said pattern as a mask, thereby exposing a portion of said surface of said underlayer;

applying a second etchant to said portion of said surface of said underlayer so as to remove a portion of said underlayer thereby exposing a portion of said surface of said substrate;

etching a portion of said substrate; and etching a further portion of said underlayer so as to cause a remaining portion of said top layer to lift off.

2. A method of etching a pattern on a semiconductor substrate, said method comprising:

forming an underlayer on a surface of said semiconductor substrate, said underlayer being homogeneous;

forming a top layer on a surface of said underlayer, said top layer being homogeneous;

creating an oxide pattern in a region at a surface of said top layer with a tip of a cantilever of a scanning probe microscope;

removing a portion of said top layer with a first etchant, using said oxide pattern as a mask, thereby exposing a portion of said surface of said underlayer;

removing a portion of said underlayer with a second etchant to expose a portion of said surface of said substrate; and etching a portion of said substrate.

3. The method of claim 2 wherein said underlayer comprises a polymer.

4. The method of claim 3 wherein said underlayer comprises polyimide.

5. The method of claim 2 wherein said top layer comprises silicon.

6. The method of claim 5 wherein said top layer comprises amorphous silicon.

7. The method of claim 5 wherein said top layer comprises polysilicon.

8. A method of etching a pattern on a semiconductor substrate, said method comprising:

forming an underlayer on a surface of said semiconductor substrate, said underlayer being homogeneous;

forming a metal top layer on a surface of said underlayer, said metal top layer being homogeneous;

creating a pattern in a region at a surface of said metal top layer with a tip of a cantilever of a scanning probe microscope;

removing a portion of said metal top layer with a first etchant, using said pattern as a mask;

removing a portion of said underlayer with a second etchant; and etching a portion of said substrate.

9. The method of claim 8 wherein said top layer comprises a metal selected from the group consisting of titanium, aluminum, chromium, copper, indium, iridium, iron, manganese, nickel, tantalum, tin and tungsten.

10. The method of claim 2 wherein said first etchant does not attack said underlayer.

11. The method of claim 2 wherein said second etchant does not attack said metal top layer.

12. The method of claim 2 wherein said second etchant does not attack said substrate.

13. The method of claim 2 wherein said second etchant does not attack said metal top layer or said substrate.

14. The method of claim 2 wherein the step of etching a portion of said substrate is performed with said first etchant.

15. A method of etching a pattern on a semiconductor substrate, said method comprising the following steps performed in the order stated:

depositing an underlayer on a surface of said semiconductor substrate;

depositing a top layer on a surface of said underlayer;

creating a pattern in a region at a surface of said top layer with a tip of a cantilever of a scanning probe microscope;

applying a first etchant to said surface of said top layer so as to remove a portion of said top layer, using said pattern as a mask, thereby exposing a portion of said surface of said underlayer;

applying a second etchant to said portion of said surface of said underlayer so as to remove a portion of said underlayer without exposing said surface of said substrate;

removing said pattern and a remaining portion of said top layer;

removing an additional portion of said underlayer so as to expose a portion of said surface of said substrate; and etching a portion of said substrate.

16. A method of etching a pattern on a semiconductor substrate, said method comprising:

depositing an underlayer on a surface of said semiconductor substrate in an oxygen-free environment;

depositing a top layer on a surface of said underlayer in an oxygen-free environment;

creating a pattern in a region at a surface of said top layer with a tip of a cantilever of a scanning probe microscope;

applying a first etchant to said surface of said top layer so as to remove a portion of said top layer, using said pattern as a mask, thereby exposing a portion of said surface of said underlayer;

allowing said portion of said surface of said underlayer to oxidize, thereby forming an oxide layer;

removing a remaining portion of said top layer and a portion of said underlayer with a second etchant, using said oxide layer as a mask; and etching a portion of said substrate.

17. The method of claim 16 wherein said underlayer comprises titanium.

18. The method of claim 16 wherein said top layer comprises amorphous silicon.

19. The method of claim 2 wherein said underlayer comprises a photoresist.

20. The method of claim 2 wherein said underlayer comprises a self-assembled monolayer (SAM).

21. The method of claim 2 wherein said underlayer comprises a Langmuir-Blodgett film.

22. The method of claim 2 wherein said scanning probe microscope comprises a scanning tunneling microscope.

23. The method of claim 2 wherein said scanning probe microscope comprises an atomic force microscope.

24. A method of etching a pattern on a substrate, said method comprising:

forming an underlayer over said substrate in an oxygen-free atmosphere;

forming a top layer over said underlayer in an oxygen-free atmosphere;

creating a pattern in a region at a surface of said top layer with a tip of a cantilever of a scanning probe microscope;

etching a portion of said top layer to expose a portion of a surface of said underlayer, using said pattern as a mask;

exposing said portion of said surface of said underlayer to oxygen, thereby forming an oxide layer.

25. The method of claim 24 wherein said underylayer comprises titanium.

26. The method of claim 24 wherein said top layer comprises amorphous silicon.

27. The method of claim 24 comprising the further step of etching at least a portion of said oxide layer and a remaining portion of said underlayer after the step of etching said substrate.

28. The method of claim 24 wherein a portion of said oxide layer is etched during said step of etching said underlayer.

29. The method of claim 2 wherein said top layer comprises silicon nitride.

30. A method of etching a pattern on a substrate, said method comprising:

forming an underlayer above said substrate;

forming a top layer above said underlayer;

creating a pattern on a surface of said top layer with a tip of a cantilever of a scanning probe microscope;

etching said top layer with a first etchant;

etching said underlayer with a second etchant; and etching said substrate, wherein said underlayer comprises polyimide.

31. A method of etching a pattern on a substrate, said method comprising:

forming an underlayer above said substrate;

forming a top layer above said underlayer;

creating a pattern on a surface of said top layer with a tip of a cantilever of a scanning probe microscope;

etching said top layer with a first etchant;

etching said underlayer with a second etchant; and etching said substrate, wherein said top layer comprises a metal.

32. The method of claim 31 wherein said top layer comprises a metal selected from the group consisting of titanium, aluminum, chromium, copper, indium, iridium, iron, manganese, nickel, tantalum, tin and tungsten.

33. The method of claim 30 wherein said pattern comprises an oxide.

34. A method of etching a pattern on a substrate, said method comprising:

depositing an underlayer on a surface of said substrate;

depositing a top layer on a surface of said underlayer;

creating a pattern on a surface of said top layer with a tip of a cantilever of a scanning probe microscope;

etching said top layer with a first etchant;

etching said underlayer with a second etchant;

etching said substrate; and etching said underlayer so as to cause a remaining portion of said top layer to lift off.

35. A method of etching a pattern on a substrate, said method comprising:

depositing an underlayer on a surface of said substrate;

depositing a top layer on a surface of said underlayer;

creating a pattern on a surface of said top layer with a tip of a cantilever of a scanning probe microscope;

etching said top layer with a first etchant;

etching said underlayer with a second etchant;

etching said substrate;

wherein said steps of depositing said underlayer and depositing said top layer are performed in an oxygen-free environment.

36. The method of claim 35 further comprising, after the step of etching said top layer, allowing an oxide to form on a surface of said underlayer.

37. The method of claim 36 further comprising the step of etching said underlayer in areas not covered by said oxide.

* * * * *